(12) United States Patent
David et al.

(10) Patent No.: US 9,705,473 B2
(45) Date of Patent: Jul. 11, 2017

(54) RESONANT CIRCUIT WITH VARIABLE FREQUENCY AND IMPEDANCE

(71) Applicant: COMMISSARIAT A L'ENERGIE ATOMIQUE ET AUX ENERGIES ALTERNATIVES, Paris (FR)

(72) Inventors: Jean-Baptiste David, Grenoble (FR); Alexandre Reinhardt, Saint Martin d'Heres (FR)

(73) Assignee: Commissariat A'Lenergie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/867,563

(22) Filed: Sep. 28, 2015

(65) Prior Publication Data

US 2016/0094199 A1 Mar. 31, 2016

(30) Foreign Application Priority Data

Sep. 29, 2014 (FR) ..................................... 14 59210

(51) Int. Cl.
*H03H 9/54* (2006.01)
*H03H 7/38* (2006.01)
(Continued)

(52) U.S. Cl.
CPC .......... *H03H 9/542* (2013.01); *H03H 3/0073* (2013.01); *H03H 3/0076* (2013.01);
(Continued)

(58) Field of Classification Search
CPC ...... H03H 3/0073; H03H 3/0076; H03H 7/38; H03H 9/542; H03H 9/545; H03H 9/568;
(Continued)

(56) References Cited

U.S. PATENT DOCUMENTS

| | | | |
|---|---|---|---|
| 6,291,924 B1 | 9/2001 | Lau et al. | |
| 6,583,688 B2 * | 6/2003 | Klee | H03H 3/04 |
| | | | 310/358 |

(Continued)

FOREIGN PATENT DOCUMENTS

| | | |
|---|---|---|
| EP | 2 240 574 A1 | 1/2012 |
| EP | 2 509 222 A1 | 10/2012 |

(Continued)

OTHER PUBLICATIONS

European Search Report in European Patent Application No. 15187022.7, dated Jun. 29, 2016.
(Continued)

*Primary Examiner* — Robert Pascal
*Assistant Examiner* — Jorge Salazar, Jr.
(74) *Attorney, Agent, or Firm* — Baker Hostetler LLP

(57) ABSTRACT

A resonant circuit comprises an input terminal and an output terminal and at least: a group of N resonators, where N≥1, the resonators having the same resonance frequency and the same antiresonance frequency; a first and a second impedance matching element having a non-zero reactance, the first element being in series with the group of resonators, and the second element being in parallel with the group of resonators, the resonant circuit comprising: first means for controlling the group of resonators, enabling the static capacitance of the group to be fixed at a first value; second control means, enabling the impedance of the first impedance matching element and that of the second element to be fixed at second values; the first and second values being such that the triplet of values composed of the static capacitance of the group, the impedance of the first element, and the impedance of the second element can be used to determine the following triplet of parameters: the characteristic impedance $Z_c$ of the assembly formed by the group, the first impedance
(Continued)

matching element and the second matching element; the resonance frequency $\bar{\omega}_r$ of the assembly; the antiresonance frequency $\bar{\omega}_a$ of the assembly, in order to stabilize the impedance of the circuit at a chosen characteristic impedance.

20 Claims, 29 Drawing Sheets

(51) Int. Cl.
    *H03H 9/70* (2006.01)
    *H03H 3/007* (2006.01)
    *H03H 9/56* (2006.01)
    *H03H 9/72* (2006.01)
    *H03H 3/02* (2006.01)
    *H03H 3/04* (2006.01)
    *H03H 9/02* (2006.01)
    *H03H 9/64* (2006.01)

(52) U.S. Cl.
    CPC ............ *H03H 7/38* (2013.01); *H03H 9/545* (2013.01); *H03H 9/568* (2013.01); *H03H 9/70* (2013.01); *H03H 9/706* (2013.01); *H03H 9/725* (2013.01); *H03H 9/6403* (2013.01); *H03H 2003/0071* (2013.01); *H03H 2003/027* (2013.01); *H03H 2003/0464* (2013.01); *H03H 2003/0471* (2013.01); *H03H 2009/02165* (2013.01); *H03H 2009/02173* (2013.01); *H03H 2009/02196* (2013.01); *H03H 2009/02204* (2013.01); *H03H 2009/02496* (2013.01); *H03H 2210/012* (2013.01); *H03H 2210/023* (2013.01); *H03H 2210/033* (2013.01)

(58) Field of Classification Search
    CPC .......... H03H 9/70; H03H 9/725; H03H 9/706; H03H 2003/0071; H03H 2003/027; H03H 2003/0464; H03H 2003/0471; H03H 9/6403
    USPC ....... 333/17.1, 17.3, 133, 186–188, 193–195
    See application file for complete search history.

(56) References Cited

U.S. PATENT DOCUMENTS

| | | | |
|---|---|---|---|
| 7,135,940 B2* | 11/2006 | Kawakubo | H03H 9/542 333/17.1 |
| 7,187,240 B2 | 3/2007 | Cathelin et al. | |
| 7,492,242 B2* | 2/2009 | Carpentier | H03H 3/04 333/188 |
| 2005/0012565 A1* | 1/2005 | Kamata | H03F 3/191 333/174 |
| 2005/0146401 A1 | 7/2005 | Tilmans et al. | |
| 2005/0212612 A1 | 9/2005 | Kawakubo et al. | |
| 2007/0296513 A1 | 12/2007 | Ruile et al. | |
| 2008/0088393 A1* | 4/2008 | Cathelin | H03H 9/17 334/84 |
| 2009/0115553 A1 | 5/2009 | Shin et al. | |
| 2011/0012696 A1 | 1/2011 | Skarp | |
| 2012/0313731 A1 | 12/2012 | Burgener et al. | |
| 2013/0169383 A1 | 7/2013 | Adkisson et al. | |
| 2014/0354512 A1 | 12/2014 | Kadota | |

FOREIGN PATENT DOCUMENTS

| | | |
|---|---|---|
| EP | 2 509 227 A1 | 10/2012 |
| EP | 2 713 508 A1 | 4/2014 |
| WO | 2013/125360 A1 | 8/2013 |
| WO | 03/055063 A1 | 6/2016 |

OTHER PUBLICATIONS

J.F. Carpentier et al., "A Tunable Bandpass BAW-Filter Architecture and its Application to WCDMA Filter," 2005 IEEE MTT-S International Microwave Symposium Digest, pp. 221-224.
S. Razafimandimby et al., "An Electronically Tunable Bandpass BAW-Filter for a Zero-IF WCDMA Receiver," Proceedings of the 32nd European Solid-State Circuits Conference, 2006, pp. 142-145.
S. Razafimandimby et al., "Digital Tuning of an Analog Tunable Bandpass BAW-filter at GHz Frequency," 33rd European Solid State Circuits Conference, 2007, pp. 218-221.
S. Gevorgian et al., "DC Field and Temperature Dependent Acoustic Resonances in Parallel-Plate Capacitors Based on SrTiO3 and Ba 0.25 Sr 0.75 TiO3 Films: Experiment and Modeling," Journal of Applied Physics 99, 124112 (2006).
R. Aigner, "Tunable Acoustic RF-Filters: Discussion of Requirements and Potential Physical Embodiments," Proceedings of the 40th European Microwave Conference, Sep. 2010, pp. 787-790.
A. Reinhardt et al., "Tunable composite piezoelectric resonators: a possible "Holy Grail" of RF filters?" IEEE 2012.
T. Komatsu et al., "Tunable Radio-Frequency Filters Using Acoustic Wave Resonators and Variable Capacitors," Japanese Journal of Applied Physics 49 (2010) pp. 07HD24-1-07HD24-4.
T. Yasue et al., "Wideband Tunable Love Wave Filter Using Electrostatically-Actuated Mems Variable Capacitors Integrated on Lithium Niobate," 16th International Solid-State Sensors, Actuators and Microsystems Conference, 2011, pp. 1488-1491.
K. Hashimoto et al., "Tunable RF SAW/BAW Filters: Dream or Reality?", Joint Conference of the IEEE International Frequency Control and the European Frequency and Time Forum, 2011.
M. Inaba et al., "A Widely Tunable Filter Configuration Composed of High Q RF Resonators and Variable Capacitors," Proceedings of the 8th European Microwave Integrated Circuits Conference, 2013, pp. 320-323.
H. Hirano et al., "Integration of BST Varactors with Surface Acoustic Wave Device by Film Transfer Technology for Tunable RF Filters," Journal of Micromechanics and Microengineering 23, (2013) 025005, pp. 1-9.
M. Pijolat et al., "Bias Controlled Electrostrictive Longitudinal Resonance in X-cut Lithium Niobate Thin Films Resonator," Applied Physics Letters 98, 232902 (2011).

* cited by examiner

Variation of the equivalent impedance as a function of the d.c. voltage

RESONANT CIRCUIT WITH VARIABLE FREQUENCY AND IMPEDANCE

CROSS-REFERENCE TO RELATED APPLICATIONS

This application claims priority to foreign French patent application No. FR 1459210, filed on Sep. 29, 2014, the disclosure of which is incorporated by reference in its entirety.

FIELD OF THE INVENTION

The field of the invention is that of resonant circuits, and more particularly that of circuits for use in radio frequency filters in which the central frequency and bandwidth are to be made to vary, in the context of wireless telecommunications applications for example.

BACKGROUND

The existing architectures of telecommunications systems are designed to be adaptable to a number of communication standards. They are referred to as multistandard architectures. This is an essential property for enabling a system to operate in multiple geographical regions, using multiple networks. To provide this function, existing systems are actually based on a set of subsystems connected in parallel, and switched according to the scenario for their use.

In particular, the transceiver of a multistandard system uses as many radio frequency filters or duplexers as are required by the number of standards to be met. The filters and duplexers have the property of selecting a fraction of the frequency spectrum, namely the fraction considered to be "useful" to the system because it contains the information to be processed.

At the present time, these filters are mostly produced by means of piezoelectric technology, and are classed in two major groups, namely filters using surface acoustic wave ("SAW") resonators and filters using bulk acoustic wave ("BAW") resonators. Filters of this type are specified in telecommunications systems because they are currently relatively easy to produce by integration methods, and therefore occupy a minimal space (a few square millimeters) at an economically acceptable cost.

However, these components operate by using a material and an architecture which require a central frequency and a bandwidth for each one.

With the multiplication of telecommunications standards and distinctive geographical features, the number of these filtering components in on-board systems is tending to increase. It will now be very useful to find a way of making filters variable in respect of their central frequency and their bandwidth, with the aim of reducing the number of filters, and ultimately using only a single filter.

Usually based on a material having piezoelectric properties, SAW/BAW filters make use of the electromechanical conversion of the energy contained in acoustic resonators in order to provide a filtering function.

Whereas the SAW filter uses acoustic vibrations confined to the surface of a piezoelectric substrate, the BAW resonator operates by the vibration within its thickness of a thin layer of piezoelectric material sandwiched between two electrodes.

FIGS. 1a, 1b and 1c show the behavior of a BAW resonator.

More precisely, FIG. 1a shows a conventional stack of materials for the production of a BAW resonator of the "solidly mounted resonator" type, comprising, on the surface of a substrate S, a stack of layers $C_i$, acting as a reflector, and a layer of piezoelectric material Mpiezo between two electrodes $E_i$ and $E_s$, covered with a dielectric layer I. FIG. 1b shows the first-order equivalent circuit of a piezoelectric resonator and FIG. 1c shows the resonance and antiresonance frequencies of the piezoelectric resonator.

In both the SAW and the BAW types, this acoustic phenomenon is interpreted in electrical terms as the arrangement of an RLC resonator in parallel with a capacitor. This model, very widely discussed in the literature, is commonly designated by the abbreviation "BVD", for "Butterworth-Van Dyke". It then has a series resonance (quasi-short-circuit) and an antiresonance (quasi open-circuit). The frequency distance separating the resonance from the antiresonance is characterized by the electromechanical coupling coefficient of the resonator, defined by the following equation:

$$k_{eff}^2 = \frac{\pi}{2} \frac{f_s}{f_p} \tan\left(\frac{\pi}{2} \frac{f_p - f_s}{f_p}\right)$$

where fs is the resonance frequency and fp is the antiresonance frequency.

This parameter is directly related to the piezoelectric properties of the material and to the vibration mode in question.

Typically, for acoustic waves propagating in AlN (aluminum nitride), the electromechanical coupling coefficient is about 7%, enabling filters to be designed with a bandwidth of about 2%.

A filter is produced by arranging a number of resonators, sometimes accompanied by additional passive elements. Typically, two kinds of resonators for filter design can be distinguished, namely resonators connected in parallel with the signal path, and resonators connected in series on the signal path. They are distinguished in electrical terms by the frequency positioning of their resonance and antiresonance frequencies, generally arranged according to the diagram of FIG. 2, which shows the response of the filter (curve $C_{2F}$).

In particular, the resonance frequency of the resonators connected in series (curve $C_{2s}$) is aligned to the antiresonance frequency of the resonators connected in parallel (curve $C_{2p}$).

Outside their distinctive frequencies, acoustic resonators exhibit capacitive behavior, and therefore exhibit an impedance which depends primarily on their equivalent static capacitance. This impedance, related to the capacitive behavior of a resonator outside its distinctive frequencies, is referred to below as the "characteristic impedance Zc". The design of this capacitor has an effect on the impedance matching of the filter. It can be shown that, when the series and parallel resonators are arranged according to the principle described above, filter matching is achieved if the impedance $Z_{eq}$ of the generator and of the load is equal to the geometric mean of the characteristic impedances of the resonators:

$$Z_{eq} = \sqrt{Z_{series} \cdot Z_{series}}$$

For example, FIG. 3 shows the topology of a duplexer (an association of two filters for information exchange in frequency duplex mode). Two groups of resonators are identified here, as well as some passive elements.

Whereas the arrangement of the resonators on the "RX" path is differential and intersecting (called a "lattice" arrangement in English), the resonators on the TX path are in what is called a "ladder" arrangement in English.

A few manufacturers currently dominate the market for BAW- or SAW-based filter/duplexers. All of these, without exception, offer sets of components, each component being designed for a specific frequency band or a specific standard (in the case of the duplexers). This is necessitated by the intrinsic properties of the piezoelectric material, and also by the architectural approach followed for the filters, as explained below in the present description.

A proposal to modify the distinctive frequencies of acoustic resonators was published in 2005, thus paving the way for variable filters, as described in the paper by Carpentier, J. F., Tilhac, C., Caruyer, G., and Dumont, F., "A tunable bandpass BAW-filter architecture and its application to WCDMA filter", 2005 IEEE MTT-S International Microwave Symposium Digest. The principle is based on the addition of capacitance and inductance, in series and in parallel, to each resonator. The authors assert that a variation of 2% in the operating frequency is possible, but this has never been demonstrated in practice.

In 2006 and 2007, however, the same team showed that the central frequency of a filter could be modified by 0.3%, using an active circuit. They concluded that the method could compensate for dispersions due to the production process. It can be assumed that this method is unlikely to lead to true agility in the filter, as described in the paper by Razafimandimby, S., Tilhac, C., Cathelin, A., and Kaiser, A., "An Electronically Tunable Bandpass BAW-Filter for a Zero-IF WCDMA Receiver" (FIG. 4 is taken from this paper), Proceedings of the 32nd European Solid-State Circuits Conference, 2006 (ESSCIRC 2006), and in the paper by Cyrille Tilhac, Andreia Cathelin, Andreas Kaiser, and Didier Belot, "Digital tuning of an analog tunable bandpass BAW-filter at GHz frequency", 33rd European Solid State Circuits Conference, 2007 (ESSCIRC 2007).

Based on the conclusions of this study, most of the teams working on this topic have searched for solutions for dispensing with the passive elements added to these resonators, by concentrating on means for modifying the propagation speed of acoustic waves.

Thus resonators based on the use of electrostrictive materials have been proposed, as described in the paper by S. Gevorgian, A. Vorobiev, and T. Lewin, "DC field and temperature dependent acoustic resonances in parallel-plate capacitors based on $SrTiO_3$ and $Ba_{0.25}Sr_{0.75}TiO_3$ films: experiment and modeling", Journal of Applied Physics 99, 124112 (2006). This is because these materials have the property of exhibiting a variation of elastic rigidity as a function of an applied electrical field. They also exhibit an effect which is equivalent to piezoelectricity, but can be intensity modulated, again as a function of an applied electrical field. However, their dielectric properties are also affected by this electrical field, preventing these components from having a constant characteristic impedance. It has been clearly stated that this variation of characteristic impedance makes it impossible to manufacture a filter based on this type of resonator. Moreover, the losses of materials having these properties, namely compounds of the BST ($Ba_xSr_{1-x}TiO_3$) or PZT ($Pb_xZr_{1-x}TiO_3$) type, are too high for the production of resonators for practical use.

Another proposed solution is that of producing what are known as composite resonators, based on the stacking of two piezoelectric layers. One of the layers is connected to the user circuit, while the other layer is connected to a tuning circuit, usually a variable capacitor for modifying the conditions at the electrical limits encountered by the bulk acoustic wave as it is propagated in the stack. Thus this structure can be used to provide a frequency-agile resonator which is controllable exclusively by a variable capacitor, as described in the paper by R. Aigner, "Tunable acoustic RF-filters: discussion of requirements and potential physical embodiments", Proceedings of the $40^{th}$ European Microwave Conference, p. 787, 2010. In this structure, highly piezoelectric materials such as lithium niobate must be used in order to provide resonators having a electromechanical coupling coefficient which is sufficient for the production of a filter, and frequency agility which is sufficient to cover a number of communication bands. However, the drawback of this structure is that it is extremely complicated, and therefore costly, to produce, since it requires the combination of two piezoelectric layers. On the other hand, this structure provides simple frequency translation of the resonator, but without allowing the independent control of the resonance or antiresonance frequency, which may prove problematic, since not all telecommunication bands have the same width: consequently, a filter cannot simply be frequency translated.

The most promising approach is that which has been followed for several years by a Japanese team led by Ken-Ya Hashimoto of the University of Chiba, amply described in the following papers: Tomoya Komatsu, Ken-ya Hashimoto, Tatsuya Omori, and Masatsune Yamaguchi, "Tunable Radio-Frequency Filters Using Acoustic Wave Resonators and Variable Capacitors", Japanese Journal of Applied Physics 49 (2010); T. Yasue, T. Komatsu, N. Nakamura, K. Hashimoto, "Wideband tunable love wave filter using electrostatically-actuated MEMS variable capacitors integrated on lithium niobate", 16th International Solid-State Sensors, Actuators and Microsystems Conference (TRANSDUCERS), 2011; Ken-Ya Hashimoto, S. Tanaka, M. Esashi, "Tunable RF SAW/BAW filters: Dream or reality?", Joint Conference of the IEEE International Frequency Control and the European Frequency and Time Forum (IFCS), 2011; M. Inaba, K.-Y. Hashimoto, T. Omori, C. Ahn, "A widely tunable filter configuration composed of high Q RF resonators and variable capacitors", European Microwave Integrated Circuits Conference (EuMIC), 2013, Hideki Hirano, Tetsuya Kimura, Ivoyl P Koutsaroff, Michio Kadota, Ken-ya Hashimoto, Masayoshi Esashi and Shuji Tanaka, "Integration of BST varactors with surface acoustic wave device by film transfer technology for tunable RF filters", Journal of Micromechanics and Microengineering 2013.

This team is engaged in demonstrating that the first approach mentioned above is in fact feasible, since resonators produced with materials having a very high electromechanical coupling coefficient are available. Indeed, the addition of variable passive elements, in series or in parallel, to an acoustic resonator enables the resonance and antiresonance frequencies to be shifted as shown in FIGS. 5a and 5b, which illustrate the effect of the capacitor in parallel (variation of capacitance Cp from 0 to 12 pF) and that of the capacitor in series (variation of capacitance Cs from ∞ to 12 pF) on the electrical response of a resonator, and more precisely on the modulus of the impedance expressed in Ω, corresponding to the notation mag(Z(1,1)) of FIGS. 5a and 5b. This is because a capacitor in parallel with a resonator creates an increase in the static capacitance of the resonator, causing a displacement of the zero susceptance of the resonator (that is to say the antiresonance) while leaving the pole (that is to say the resonance) unchanged. Conversely, the addition of a capacitor in series with a resonator creates a decrease in its characteristic impedance, and causes a displacement of the zero reactance (that is to say the resonance) while leaving the pole (that is to say the antiresonance) unchanged. The resonance and antiresonance frequencies of the resonator can therefore be shifted substantially within the limits of the range delimited by the resonance and antiresonance frequencies of the original resonator without the adjusting capacitive elements (the curve drawn in solid lines). A very high electromechanical coupling coefficient becomes the necessary condition for very high frequency agility.

The topologies shown in FIGS. 6a and 6b for making use of this principle have been known since 2010, when they were described in the paper by Tomoya Komatsu, Ken-ya Hashimoto, Tatsuya Omori, and Masatsune Yamaguchi, "Tunable Radio-Frequency Filters Using Acoustic Wave Resonators and Variable Capacitors", Japanese Journal of Applied Physics 49 (2010), and are very similar to those investigated by French teams. The authors of this study have taken the approach of using components making use of surface acoustic waves having the highest possible electromechanical coupling coefficient (over 30% in this case), by selecting lithium niobate substrates from a section not normally used by SAW filter designers, since its electromechanical coupling coefficients are too high to allow filter synthesis in the conventional manner.

Depending on the way in which resonators and capacitors are associated, as shown in the topology of FIG. 6a or FIG. 6b, the authors consider that the type of response shown in FIGS. 7a and 7b, respectively, can be obtained.

The filter of FIG. 7a has a relative bandwidth of approximately 17%, based on the use of a piezoelectric material with $k^2$ equal to 28%. It can be seen that, according to the method indicated in FIG. 6a, the band of the filter is reduced at its lower edge, while being only very slightly increased at its upper edge. In this case, therefore, the aim is to reduce the bandwidth by essentially shifting one edge. This causes the effective central frequency to be modified equally, with a rate of about 3% in this case.

In the case of FIG. 7b, the authors construct a filter with a width of 5%, and make the central frequency vary by 5%. Two filters are therefore seen side by side. Agility, in the true sense of the word, is therefore demonstrated: the method is functional.

However, the application of this solution is extremely limited. In fact, the authors of the study provide two filters with a band of 5%, centered on 4% and 9% of the resonance frequency of the series resonators. In other words, they do not attempt to cover the whole spectrum that might be expected to be usable, in view of the 30% coupling coefficient. A more detailed analysis of these papers shows that, very rapidly, the values of the associated capacitors become such that the characteristic impedance of the filter varies in such a pronounced way that its matching is no longer assured. This can be seen in FIG. 8 (where all the components are assumed to be lossless). The horizontal axis shows a relative frequency, equivalent to a percentage of the natural resonance of the series resonators. Thus the middle filter band is centered on 0.06, that is to say 6% of the natural resonance frequency of the series resonators.

The shifting of the resonances and antiresonances over a large range of variation (at the limit, over the whole range allowed by the coupling coefficient) is based on the use of variable capacitors whose values are either very large or very small relative to the natural capacitance of the resonators. Consequently the matching conditions are no longer met, and the insertion losses of the filter increase. This can be seen, notably, in the curves centered on 0% and 11%.

The mismatching also creates a standing wave ratio (VSWR) at the inputs and outputs of the filter. A generally satisfactory standing wave ratio is equal to 2, corresponding to a reflection coefficient of −10 dB. Many systems tolerate a VSWR of 2.5, or even −7.5 dB. However, filters located on the power transmission path are very strict, and the lowest possible VSWR is desirable (the theoretical minimum is 1). In the filters located at 0% and 11% in FIG. 8, the VSWR is well over 20.

In this context, and in order to gain a clearer understanding of the problems, the present applicants conducted a more detailed study of the example of configuration shown in FIG. 9, which represents a "ladder" filter architecture, shown between the references Num4 and Num5.

On the basis of this architecture, the applicants have attempted to handle a number of frequency bands, namely the TX bands numbered 28, 17, 13, 8 and 5 of the LTE protocol, these bands being shown in FIGS. 10, 11, 12, 13 and 14 respectively. Their simultaneous coverage requires a filter capable of movement over a frequency range from 734 to 960 MHz, produced on the basis of a single resonator: only the series and parallel capacitors change from one band to another. The resonator was designed in an optimal manner (that is to say, for matching the filter to the generator and the load) over band 28 (758-803 MHz):

FIGS. 10a, 11a, 12a, 13a and 14a relate to the transmission response of the filter ($S_{21}$ or $S_{12}$);

FIGS. 10b, 11b, 12b, 13b and 14b relate to the reflection response of the filter ($S_{11}$ or $S_{22}$), or more precisely:
  the curves $C_{10b1}$, $C_{11b1}$, $C_{12b1}$, $C_{13b1}$ and $C_{14b1}$ relate to the reflection response S(4,4), expressed in dB, of the filter shown in FIG. 9;
  the curves $C_{10b2}$, $C_{11b2}$, $C_{12b2}$, $C_{13b2}$ and $C_{14b2}$ relate to the reflection response S(5,5), expressed in dB, of the filter shown in FIG. 9;

FIGS. 10c, 11c, 12c, 13c and 14c relate to the standing wave ratio (VSWR) calculated at the port Num4;

FIGS. 10d, 11d, 12d, 13d and 14d show:
  the curves $C_{10d1}$, $C_{11d1}$, $C_{12d1}$, $C_{13d1}$ and $C_{14d1}$ relating to the impedance of a resonator known as a "relaxed" resonator, that is to say one having no variable capacitor, this impedance being determined by its dimensions and the technological characteristics of the piezoelectric layer;
  the curves $C_{10d2}$, $C_{11d2}$, $C_{12d2}$, $C_{13d2}$ and $C_{14d2}$ relating to the impedance response of the parallel component, composed of the "relaxed" resonator and the associated capacitors;
  the curves $C_{10d3}$, $C_{11d3}$, $C_{12d3}$, $C_{13d3}$ and $C_{14d3}$ relating to the response of the series component, composed of a resonator identical to that of the parallel component, and associated capacitors which differ from those of the parallel component.

Points m7 and m9 relate to frequencies of 689 MHz and 923 MHz respectively, and have respective impedances of −6.5 dB and 90 dB.

As anticipated by the prior art, it is found that, when an optimal resonator is defined for band 28, it is possible to achieve, for example, the provision of band 17 (734-746 MHz), whereas the other bands cannot be provided in correct conditions, that is to say with a standing wave ratio of about 2.

The applicants have also conducted a study by selecting an optimal resonator for the center of the range of variation, that is to say centered on 800 MHz (allowing optimal operation in band 13 and three times as much as that calibrated for band 28): the same conclusion is reached. The conclusions would be the same if the study were based on an optimization on the band with the highest frequency.

FIGS. 15a, 15b, 15c and 15d relate, respectively, to the insertion losses, to the matching, to the impedance (without series capacitor and without parallel capacitor) and to the impedance of the pairs of resonant circuits (with variable values of series capacitance and parallel capacitance) for a variable filter centered on 800 MHz. FIG. 15d clearly shows a problem of impedance variation for the different curves, relating to a frequency shift of about 60 MHz around the central frequency of 800 MHz.

The constraint arises not from the operating frequency, but from the frequency range that is to be covered, and the bandwidth of each filter that is to be provided.

An inspection of the impedance curves of the resonators reveals that, when there is a movement in frequency, from the series resonance frequency to the parallel resonance frequency of the "relaxed" resonator, the characteristic impedance of the resonant circuit increases. The resonant circuits of the filter centered on 800 MHz exhibit a characteristic impedance of about 50 ohms, while they vary by about 10 ohms and about 200 ohms, respectively, at −60 MHz and +60 MHz. This dispersion of characteristic impedance is the main cause of the limitations of this approach.

For this reason, and in this context, the applicants propose a new solution for stabilizing the characteristic impedance of a resonant circuit comprising a resonator at a chosen value and making it possible, notably, to produce filters with an adjustable central frequency and an equally adjustable band, while ensuring their impedance matching.

The following description explains the inventive reasoning followed by the applicants which has enabled them to develop the solution according to the present invention.

Starting from the aforementioned problems of the prior art solutions, the applicants have investigated a method counter to the prior art, and, rather than causing the capacitances associated with a fixed resonator to vary, the applicants have studied the operation of a BAW filter constructed on the basis of a resonator (single layer) with a variable surface (and therefore a variable static capacitance), and with fixed associated capacitors, even though the variation of the static capacitance of a piezoelectric resonator is not a parameter that is directly imposed. In fact, the surface or thickness of a resonator is determined by the technology, being a matter of the physical dimensions of the component. This option is therefore available for the electrostrictive resonators mentioned in the prior art, although these are accompanied by other constraining effects.

Thus, on the basis of the topology shown in FIG. 9, and with the associated capacitors fixed at the values corresponding to the optimal values for band 13, the applicants have studied the behavior while changing only the surface of the resonator. In this case, they obtained the results shown in FIGS. 16a, 16b, 16c and 16d for resonators with a side measurement varying from 50 μm to 300 μm. FIGS. 16a, 16b, 16c and 16d relate, respectively, to the insertion losses, to the matching, to the impedance (without series capacitor and without parallel capacitor) and to the impedance of the pairs of resonant circuits (with fixed values of series capacitance and parallel capacitance):

FIG. 16a clearly shows that the insertion losses are maintained;

FIG. 16b clearly shows that the matching is maintained;

FIG. 16c clearly shows the variation of the characteristic impedance as a function of the surface;

FIG. 16d clearly shows that the characteristic impedance of the pairs of resonant circuits is maintained.

The smallest "relaxed" resonator is located at a lower frequency, while the largest "relaxed" resonator is located at a higher frequency. It can be seen that the response of the device is such as to produce a filter of about 20 MHz (that is to say, 2.5% of bandwidth at 800 MHz), matched from 725 MHz to 875 MHz, that is to say more than 18% around 800 MHz. On the other hand, the plot of the impedance of the series and parallel resonators shows that they all have the same characteristic impedance, located around 50 ohms. FIG. 16d is remarkable in that it demonstrates this stability of impedance.

Finally, it is also very interesting to note that the relative positioning of the distinctive frequencies of the series and parallel resonators is preserved, regardless of the chosen surface of the "relaxed" resonator.

Therefore the filter constructed in this way has the property of having a fixed bandwidth and a variable central frequency.

The applicants have thus demonstrated that it becomes possible to use a simple elementary component (a simple layer of material) having a high coupling coefficient (for example, with materials such as lithium niobate (LiNbO$_3$, or LNO) or potassium niobate (KNbO$_3$)) and a variable impedance to achieve what was proposed in the prior art using composite resonators as described in the paper by A. Reinhardt, E. Defaÿ, F. Perruchot, C. Billard, "*Tunable composite piezoelectric resonators: a possible 'Holy Grail' of RF filters?*", Proceedings of the International Microwave Symposium, 2012.

Furthermore, this new "variable impedance resonator" can also be associated with a variable reactive component in series and another in parallel. In fact, this association makes it possible to have complete freedom as regards the frequency positioning of the resonance, the antiresonance, and the impedance of the assembly. Therefore it becomes possible to construct filters with variable bandwidth and a variable central frequency.

Thus, on the basis of the common filtering topology at any band located between 700 MHz and 850 MHz, for example the TX bands 28, 17, 13 and 5, shown in FIG. 17, the applicants have demonstrated that it is, notably, possible to construct, for example, filters suitable for the TX bands numbered 28, 17, 13 and 5, and meeting the specifications for a possible production of 4 duplexers in one, by adjusting the surface of each resonator, as well as the associated capacitors in series and in parallel.

More precisely, the table below shows all the values of surface, series capacitors and parallel capacitors used in the topology shown in FIG. 17, to provide the filtering functions shown in FIG. 18, configured for the TX bands 28, 17, 13 and 5.

| Band 28 | | Band 13 | |
|---|---|---|---|
| P = 70 × 70 μm | P2 = 80 × 80 μm | P = 250 × 250 μm | P2 = 250 × 250 μm |
| $C_s(P) = \infty$ | $C_s(P2) = \infty$ | $C_s(P) = 15.2$ pF | $C_s(P2) = 15.5$ pF |
| $C_p(P) = 6.7$ pF | $C_p(P2) = 7.5$ pF | $C_p(P) = 18$ pF | $C_p(P2) = 18$ pF |

-continued

| | | | |
|---|---|---|---|
| S = 105 × 105 μm | S2 = 55 × 55 μm | S = 200 × 200 μm | S2 = 150 × 150 μm |
| $C_s(S)$ = 11.8 pF | $C_s(S2)$ = 4.2 pF | $C_s(S)$ = 4.8 pF | $C_s(S2)$ = 2.6 pF |
| $C_p(S)$ = 6.8 pF | $C_p(S2)$ = 1.4 pF | $C_p(S)$ = 10.3 pF | $C_p(S2)$ = 5.8 pF |
| Band 17 | | Band 5 | |
| P = 100 × 100 μm | P2 = 100 × 100 μm | P = 300 × 300 μm | P2 = 300 × 300 μm |
| $C_s(P)$ = ∞ | $C_s(P2)$ = ∞ | $C_s(P)$ = 11.1 pF | $C_s(P2)$ = 11.2 pF |
| $C_p(P)$ = 12.1 pF | $C_p(P2)$ = 14 pF | $C_p(P)$ = 11.9 pF | $C_p(P2)$ = 12.1 pF |
| S = 70 × 70 μm | S2 = 50 × 50 μm | S = 180 × 180 μm | S2 = 125 × 125 μm |
| $C_s(S)$ = 5.7 pF | $C_s(S2)$ = 2.8 pF | $C_s(S)$ = 3.7 pF | $C_s(S2)$ = 1.7 pF |
| $C_p(S)$ = 5.2 pF | $C_p(S2)$ = 2.4 pF | $C_p(S)$ = 2.1 pF | $C_p(S2)$ = 1.1 pF |

The applicants have thus been able to demonstrate that the same stacking method and the same topology can be used to construct, notably, the RX filters of the same bands 28, 17, 13 and 5.

The approach described above proves that, with the present invention, it becomes possible to design, notably, a reconfigurable filter covering any frequency band located between 700 and 900 MHz, that is to say a frequency coverage of 25%.

SUMMARY OF THE INVENTION

For this reason, and in a general manner, the present invention proposes a resonant circuit, with a characteristic impedance stabilized at a chosen value, comprising an input terminal and an output terminal, and at least:

a group of N resonators, where N≥1, said resonators having the same resonance frequency and the same antiresonance frequency;

a first impedance matching element and a second impedance matching element having a non-zero reactance, the first impedance matching element being in series with said group of resonators, and the second impedance matching element being in parallel with said group of resonators, said resonant circuit comprising:

first means for controlling said group of resonators, enabling the static capacitance of said group to be fixed at a first value;

second control means, enabling the impedance of the first impedance matching element and that of the second impedance matching element to be fixed at second values;

said first and second values being such that:

the triplet of values composed of the static capacitance of said group, the impedance of the first impedance matching element, and the impedance of the second impedance matching element can be used to determine the following triplet of parameters:

the characteristic impedance $\overline{Z_c}$ of the assembly formed by said group, said first impedance matching element and said second matching element;

the resonance frequency $\overline{\omega_r}$ of said assembly formed by said group, said first impedance matching element and said second matching element;

the antiresonance frequency $\overline{\omega_a}$ of said assembly formed by said group, said first impedance matching element and said second matching element, in order to stabilize the impedance of said circuit at a chosen characteristic impedance.

In the context of the invention, said assembly formed by said group, said first impedance matching element and said second matching element has the impedance of a Butterworth-Van Dyke (BVD) model.

According to variants of the invention, said group of N resonators being composed of a plurality of resonators Ri, said first control means comprise a switching circuit for selecting and connecting one or more resonators.

According to variants of the invention, the resonators are bulk acoustic wave (BAW) resonators which may have different geometrical dimensions.

According to variants of the invention, the resonators are surface acoustic wave (SAW) resonators which may have different arrangements of electrodes on the surface of a piezoelectric substrate.

According to variants of the invention, the number N being equal to 1, said resonator has a variable capacitance whose value is a function of the value of an electrical control signal, said first means comprising means for causing said electrical control signal to vary.

Said resonator can be an electrostrictive resonator based on BST material.

According to variants of the invention, at least one impedance matching element is a capacitor, an inductance or a set of passive elements.

According to variants of the invention, at least one impedance matching element is an active circuit which may comprise transistors.

According to variants of the invention, the second impedance matching element is connected, on the one hand, to one of the input/output terminals, and on the other hand to an intermediate node between the group of resonators and said first impedance matching element.

According to variants of the invention, the second impedance matching element is placed between the input and output terminals, fitted in parallel with the assembly composed of the group of resonators and the first impedance matching element, placed in series.

According to variants of the invention, the resonant circuit comprises:

a first chip comprising at least said first control means for fixing the static capacitance of said group at a first value;

a second chip comprising said group of resonators;

means for the interconnection of said first control means with said group of resonators.

According to variants of the invention, the first chip also comprises the first and second impedance matching elements.

According to variants of the invention, the second chip also comprises the first and second impedance matching elements.

The invention also proposes a filter comprising a set of resonant circuits according to the invention.

The invention further proposes a duplexer comprising a set of resonant circuits according to the invention.

The invention additionally proposes a device comprising a set of at least two resonant circuits according to the invention and having an input impedance and an output impedance, contained between an input port and an output port, characterized in that it comprises:

first means for controlling the group of resonators and second means for controlling the first and second impedance matching elements, for adjusting:
the characteristic impedance of each of said circuits;
the resonance and antiresonance frequencies of each of said circuits.

The invention also proposes a device comprising a set of at least two resonant circuits according to the invention, characterized in that said first means for controlling the group of resonators and said second means for controlling the first and second impedance matching elements cause variations of the triplets of values composed of the static capacitance of said group, the impedance of the first impedance matching element, and the impedance of the second impedance matching element, for the purpose of:
adjusting the values of characteristic impedance of the two resonant circuits to fixed values;
causing the resonance and antiresonance frequencies of the two resonant circuits to vary.

The invention also proposes a device comprising a set of at least two resonant circuits according to the invention, characterized in that said first means for controlling the group of resonators and said second means for controlling the first and second impedance matching elements cause variations of the triplets of values composed of the static capacitance of said group, the impedance of the first impedance matching element, and the impedance of the second impedance matching element, for:
causing the values of characteristic impedance of the two resonant circuits to vary;
adjusting the resonance and antiresonance frequencies of the two resonant circuits to fixed values.

BRIEF DESCRIPTION OF THE DRAWINGS

The invention will be more clearly understood and other advantages will be apparent from the following description provided in a non-limiting way, and with the aid of the attached drawings, in which.

DETAILED DESCRIPTION

In a general way, the resonant circuit according to the present invention comprises:

a group of N resonators, where N≥1, said resonators having the same resonance frequency and the same antiresonance frequency, and where the group may advantageously have a high intrinsic coupling coefficient (operating within the range of frequency agility) which ideally exceeds 10%, or even 50%, associated with a first impedance matching element which may be a variable capacitor in series with said group, and a second impedance matching element which may be a variable capacitor in parallel (operating within the bandwidth of the filter and the impedance matching, in association with said group).

The resonant circuit according to the present invention further comprises:

first means for fixing the static capacitance of said group at a first value;

second control means for fixing the impedance of the first impedance matching element and that of the second impedance matching element at second values.

The first and second control means for causing the variation of, respectively, the characteristic impedance Zc of said first group and the impedances of the first and second impedance matching elements are typically selective addressing means which may typically be switches with associated controls.

Figure 19:
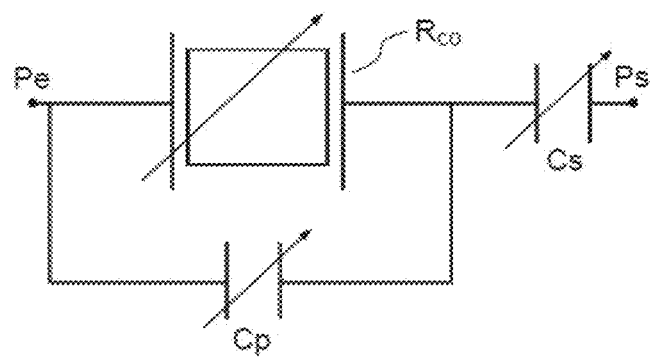
FIG. 19 shows schematically a first example of a resonant circuit according to the invention.

FIG. 19 shows a first variant of a resonant circuit according to the invention, the non-zero reactance elements being capacitors.

This figure shows, between an input terminal or port Pe and an output terminal or port Ps, the group represented schematically by a resonator $R_{C0}$ with a variable static capacitance $C_0$, associated with the non-zero reactance impedance matching element represented by a variable capacitor in series Cs and associated with the second non-zero reactance impedance matching element represented by a variable capacitor in parallel Cp, the arrows indicating a control for causing, notably, the impedance values to vary.

It should be noted that the variable capacitors may also be replaced by variable inductances in series and in parallel, or by a combination of inductances and capacitors in series and in parallel. The properties of the assembly are then substantially different, and potentially open the way to new applications of the invention. In fact, the invention assumes the association of variable reactive elements of any kinds with a group of resonators forming a resonator with variable characteristic impedance.

Figure 1A:
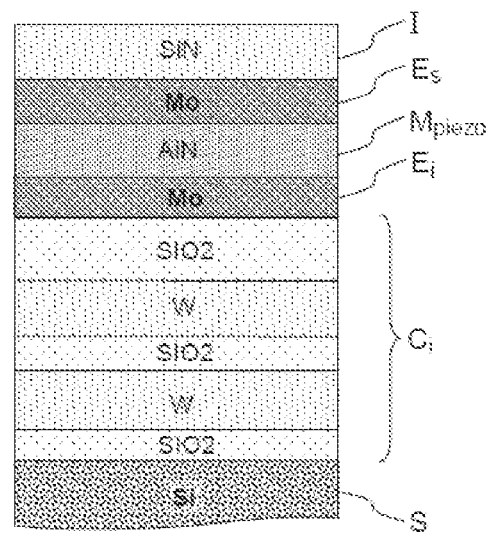
FIGS. 1a, 1b and 1c show, respectively, a conventional BAW resonator stack, the equivalent circuit and the resonance and antiresonance frequencies of this resonator.
Figure 1B:
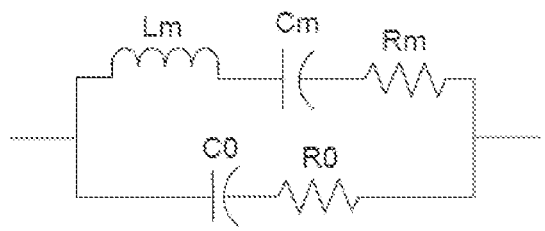
Figure 1C:
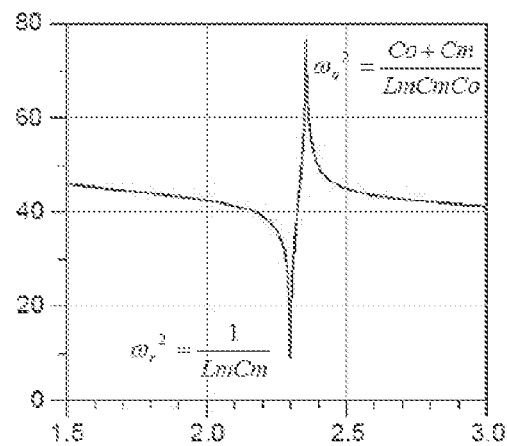
Figure 2:
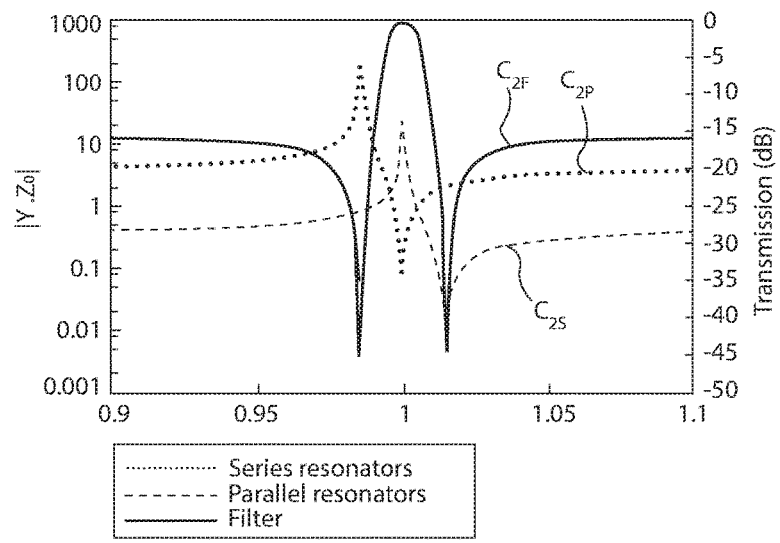
FIG. 2 shows the response of a filter composed of acoustic resonators.
Figure 3:
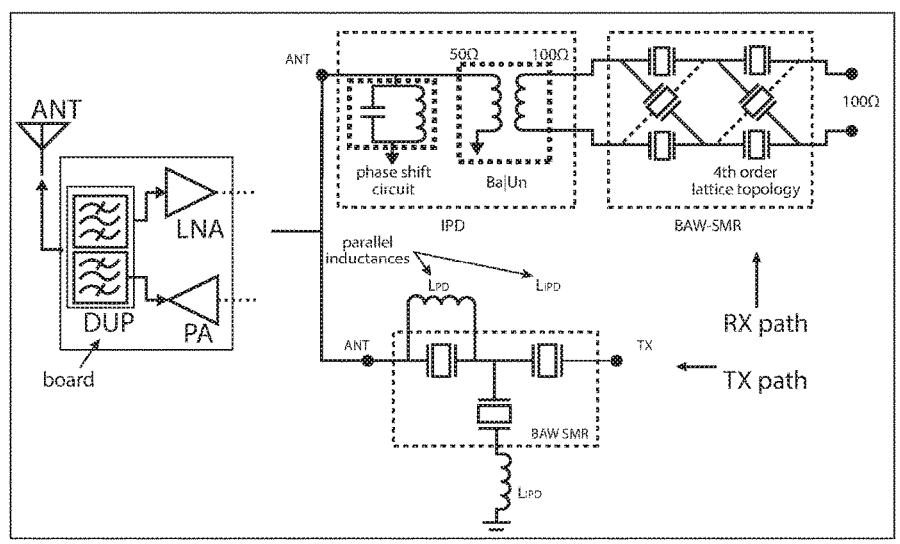
FIG. 3 shows an example of topology for a UMTS duplexer based on BAW resonators.
Figure 4:
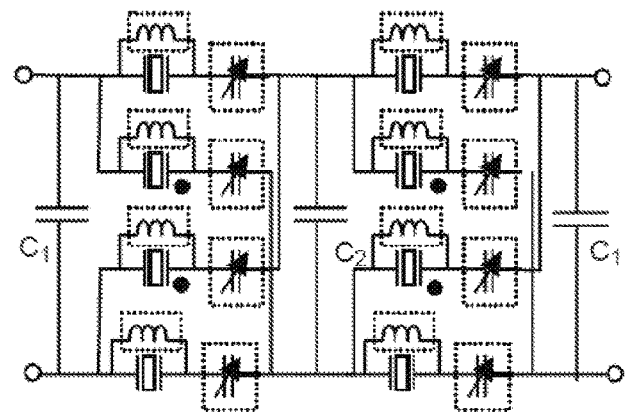
FIG. 4 shows a prior art topology intended to associate resonators and variable capacitors.
Figure 5A:
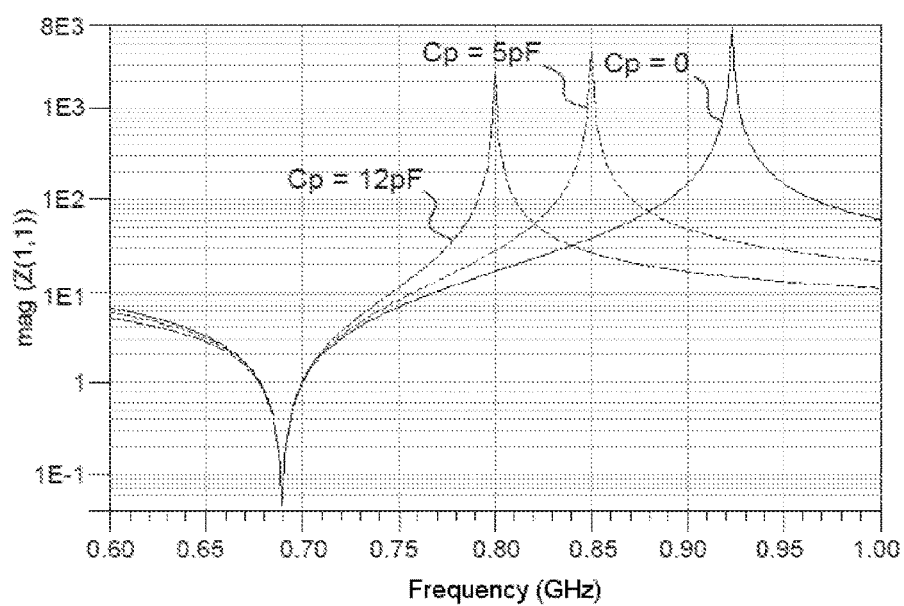
FIGS. 5a and 5b show the effect of a capacitor connected in parallel and that of a capacitor connected in series on the electrical response of a resonator.
Figure 5B:
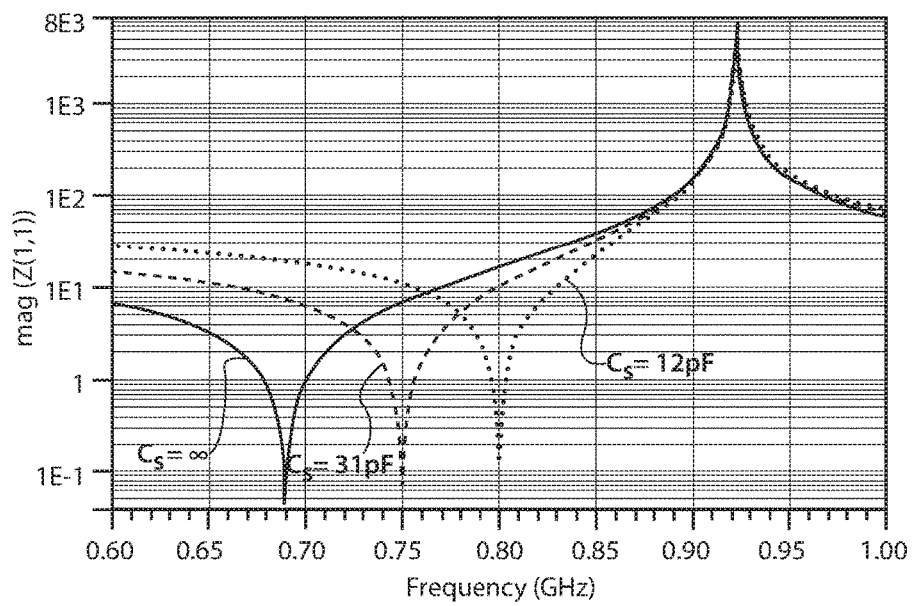
Figure 6A:
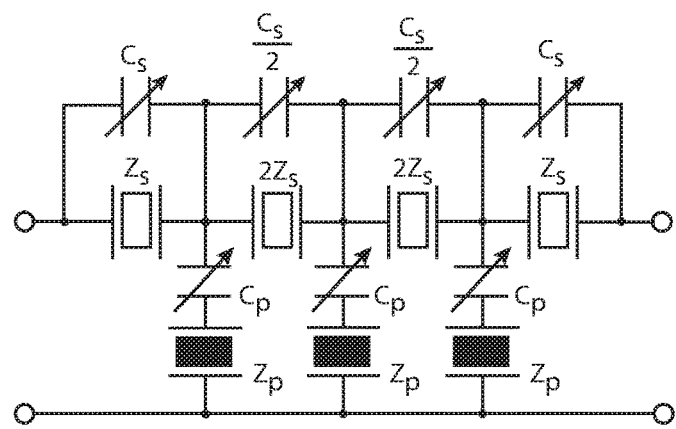
FIGS. 6a and 6b show examples of prior art topology associating variable capacitors in series and in parallel with resonators.
Figure 6B:
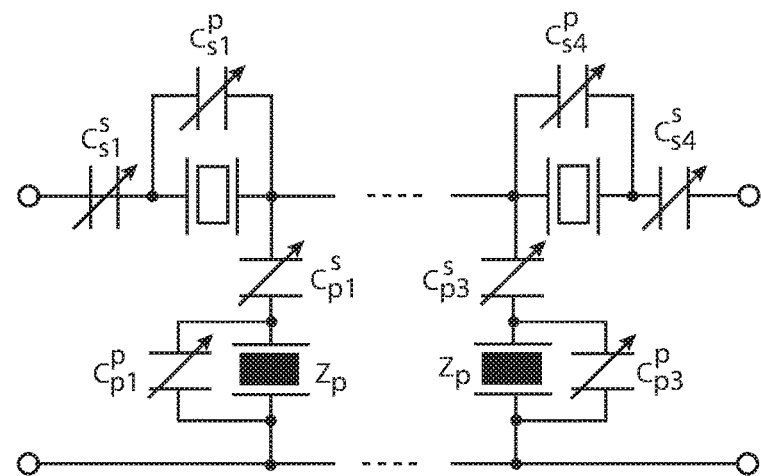
Figure 7A:
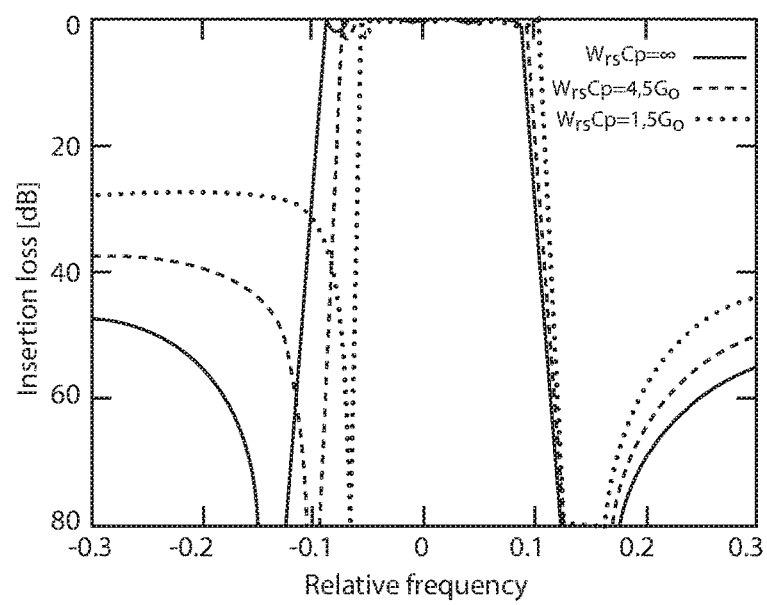
FIGS. 7a and 7b show the variation of the losses as a function of frequency for the two examples shown in FIGS. 6a and 6b.
Figure 7B:
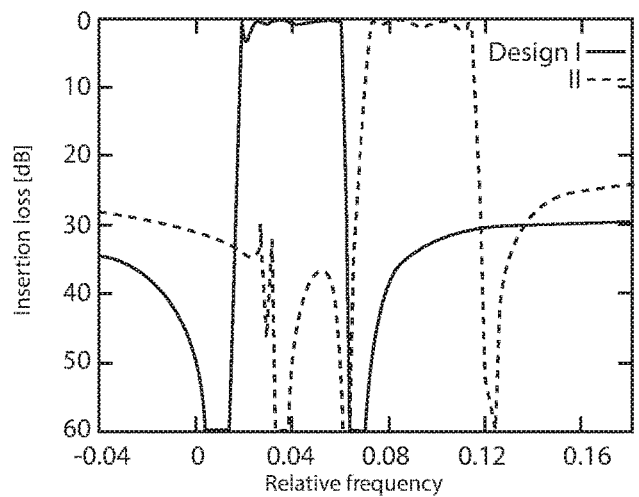
Figure 8:
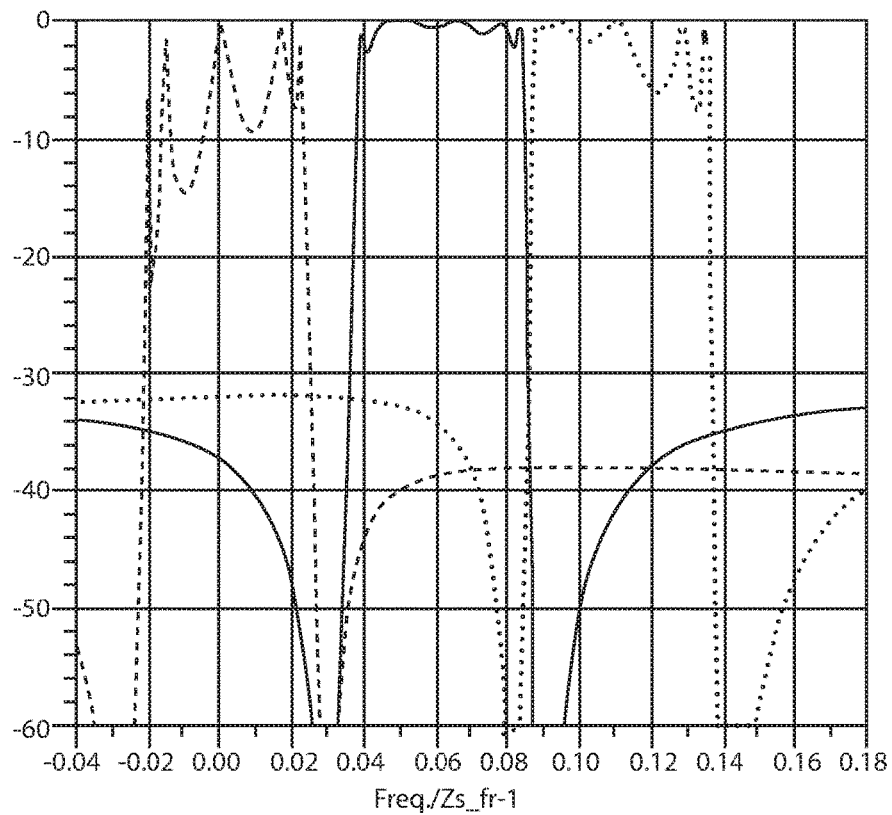
FIG. 8 shows the response in terms of mismatching of filters when they are centered on 0% and 11% of the resonance of the resonators in series, according to the topology shown in FIG. 7b.
Figure 9:
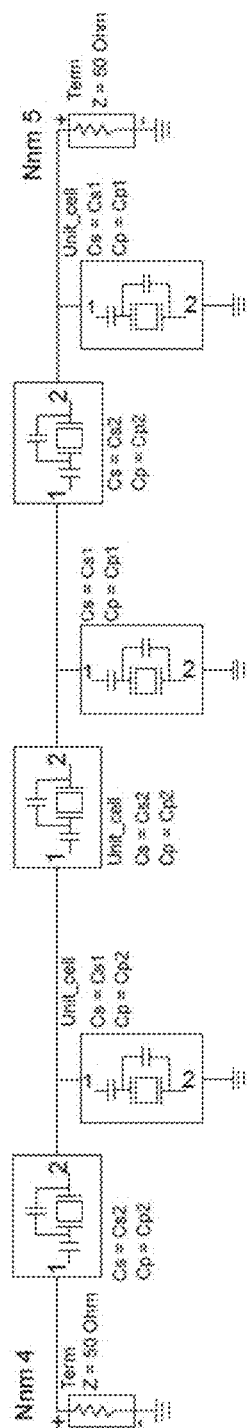
FIG. 9 shows an example of a "ladder" filter architecture.
Figure 10A:
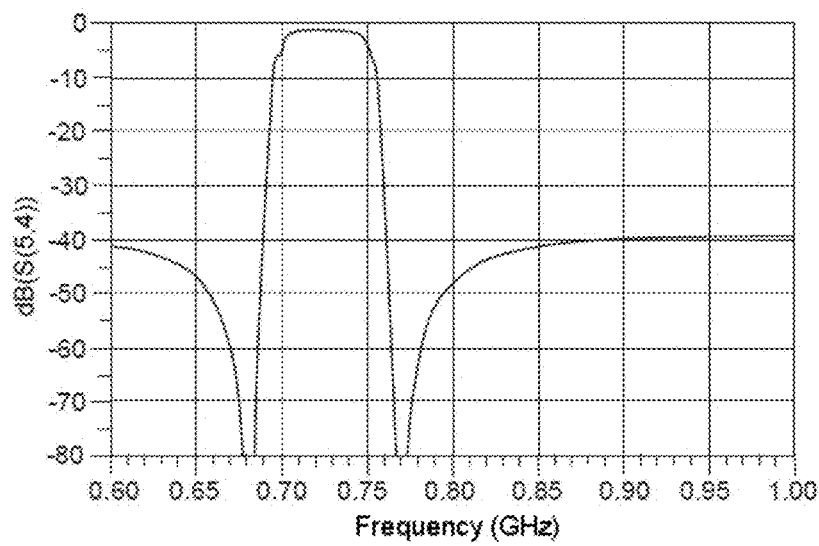
FIGS. 10a, 11a, 12a, 13a and 14a relate to the transmission response of the filter ($S_{21}$ or $S_{12}$) shown in FIG. 9.
Figure 10B:
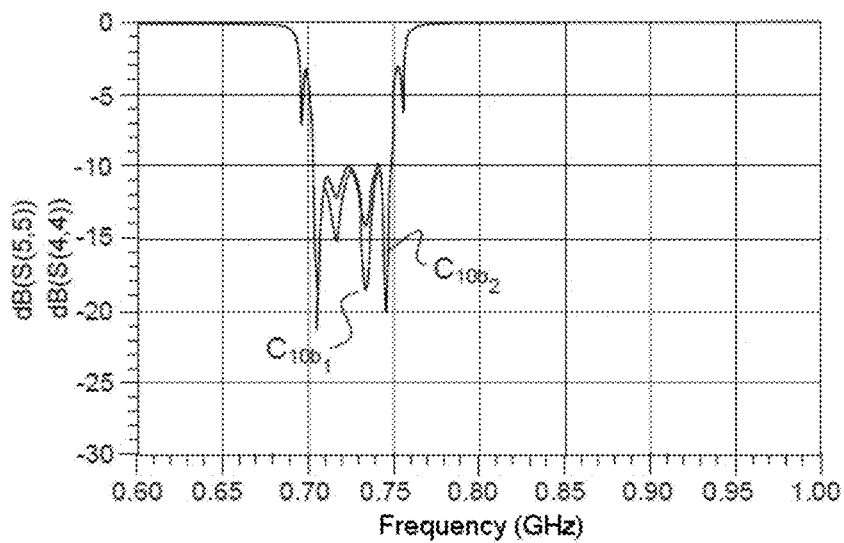
FIGS. 10b, 11b, 12b, 13b and 14b show, for the filter illustrated in FIG. 9:
the curves $C_{10b1}$, $C_{11b1}$, $C_{12b1}$, $C_{13b1}$ and $C_{14b1}$ relate to the reflection response S(4,4), expressed in dB, of the filter shown in FIG. 9;
the curves $C_{10b2}$, $C_{11b2}$, $C_{12b2}$, $C_{13b2}$ and $C_{14b2}$ relate to the reflection response S(5,5), expressed in dB, of the filter shown in FIG. 9.
Figure 10C:
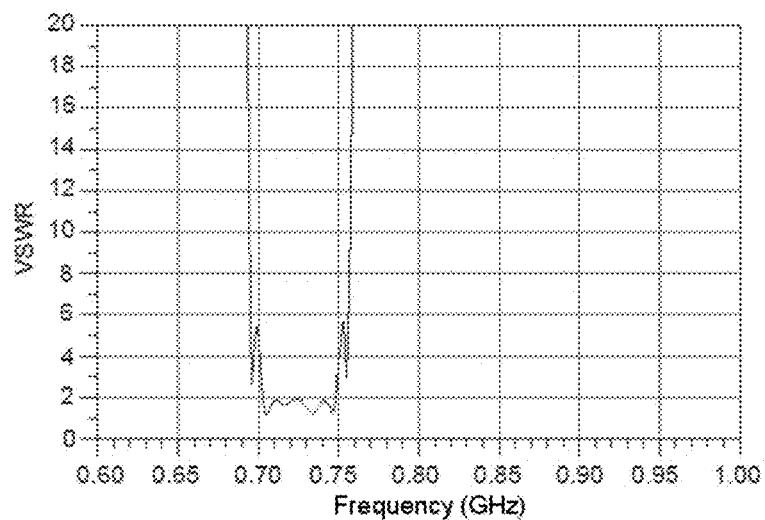
FIGS. 10c, 11c, 12c, 13c and 14c relate to the standing wave ratio (VSWR) calculated at the node Num4 shown in FIG. 9.
Figure 10D:
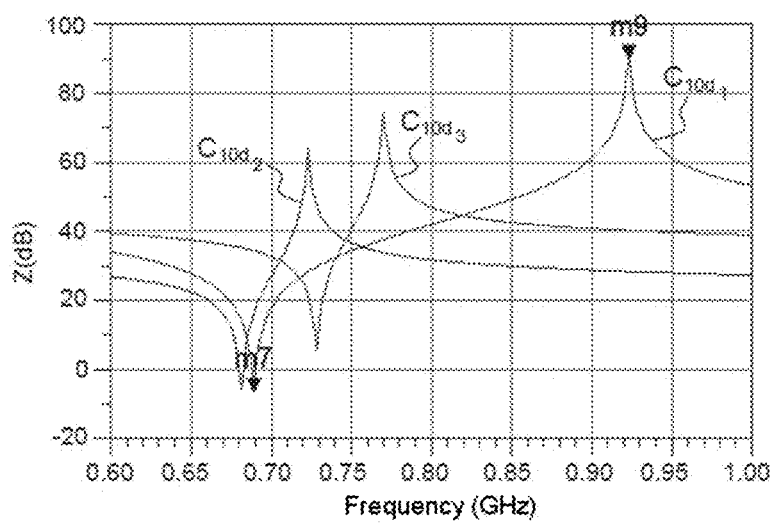
FIGS. 10d, 11d, 12d, 13d and 14d show, for the filter illustrated in FIG. 9:
the curves $C_{10d1}$, $C_{11d1}$, $C_{12d1}$, $C_{13d1}$ and $C_{14d1}$ relating to the impedance of a resonator known as a "relaxed" resonator, that is to say one having no variable capacitor, this impedance being determined by its dimensions and the technological characteristics of the piezoelectric layer;
the curves $C_{10d2}$, $C_{11d2}$, $C_{12d2}$, $C_{13d2}$ and $C_{14d2}$ relating to the impedance response of the parallel component, composed of the "relaxed" resonator and the associated capacitors;
the curves $C_{10d3}$, $C_{11d3}$, $C_{12d3}$, $C_{13d3}$ and $C_{14d3}$ relating to the response of the series component, composed of a resonator identical to that of the parallel component, and associated capacitors which differ from those of the parallel component.
Figure 11A:
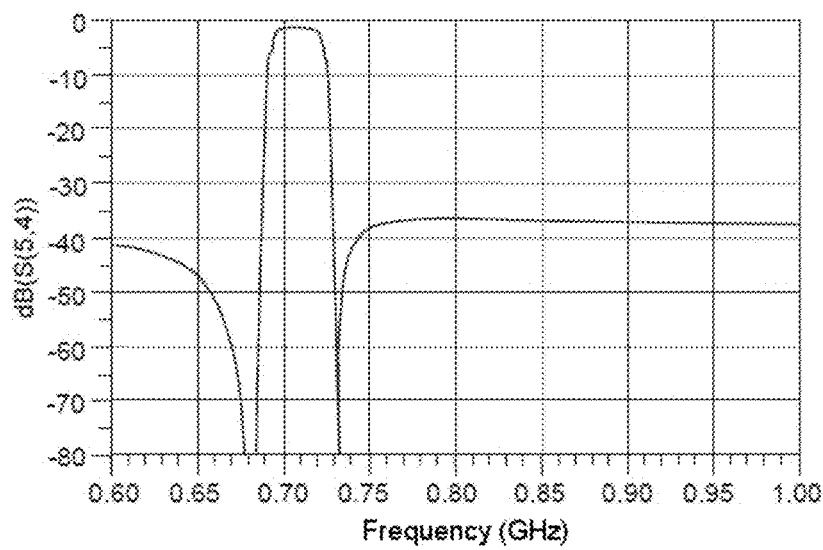
Figure 11B:
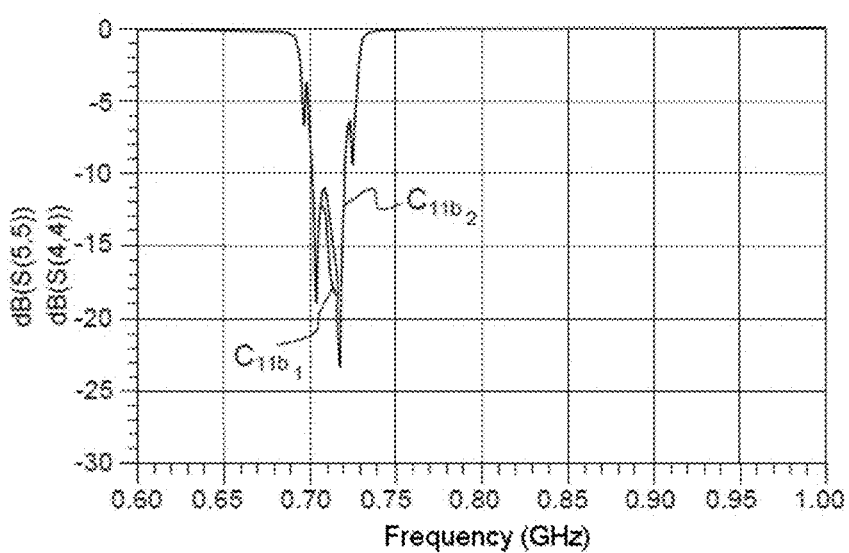
Figure 11C:
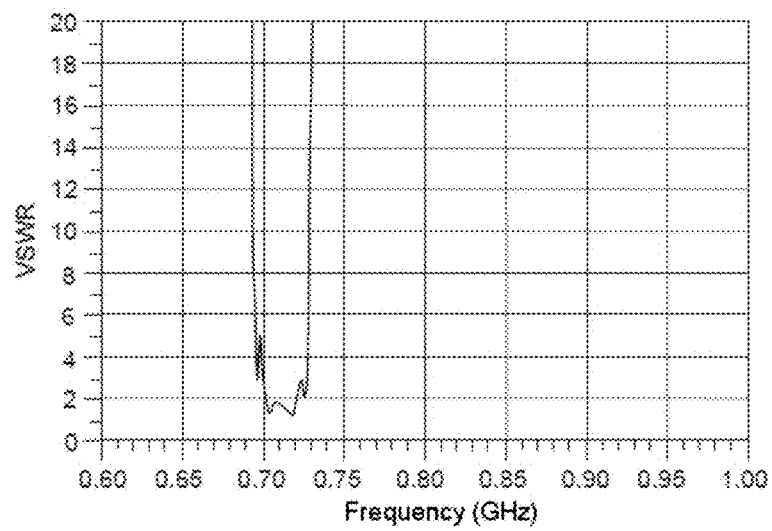
Figure 11D:
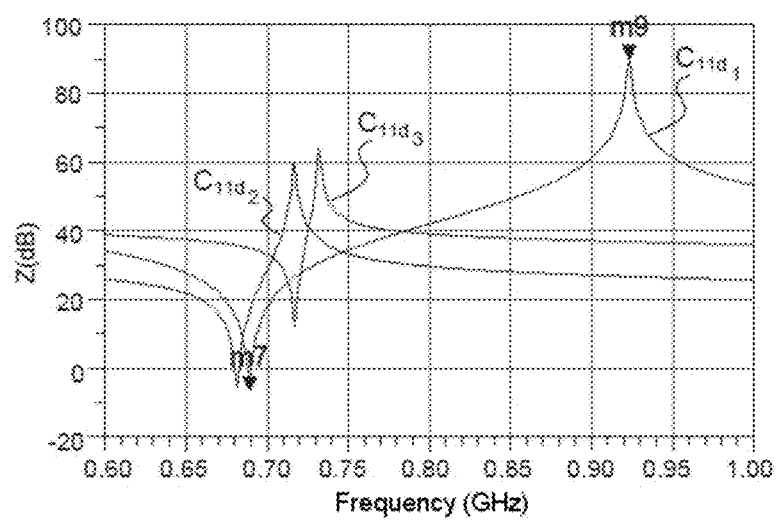
Figure 12A:
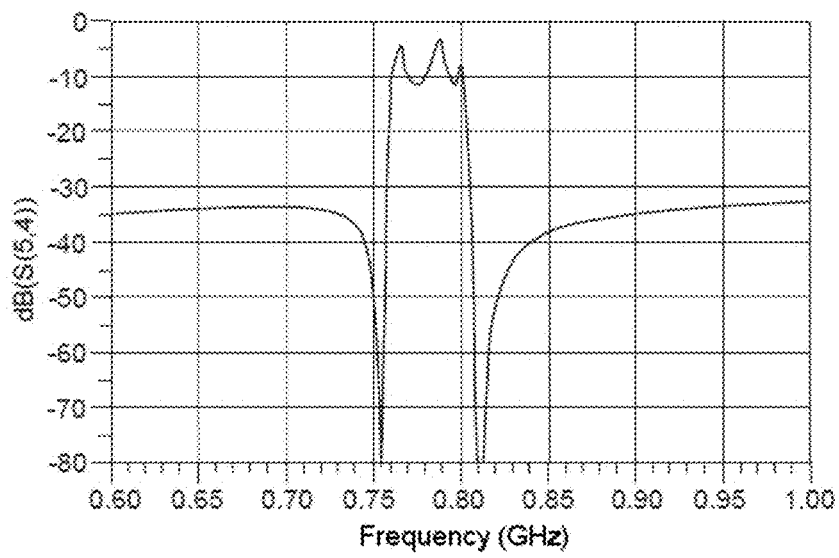
Figure 12B:
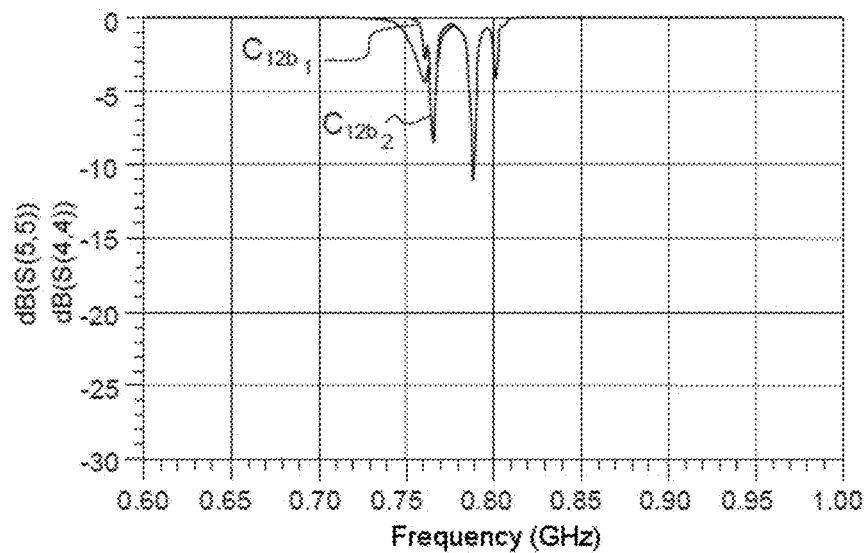
Figure 12C:
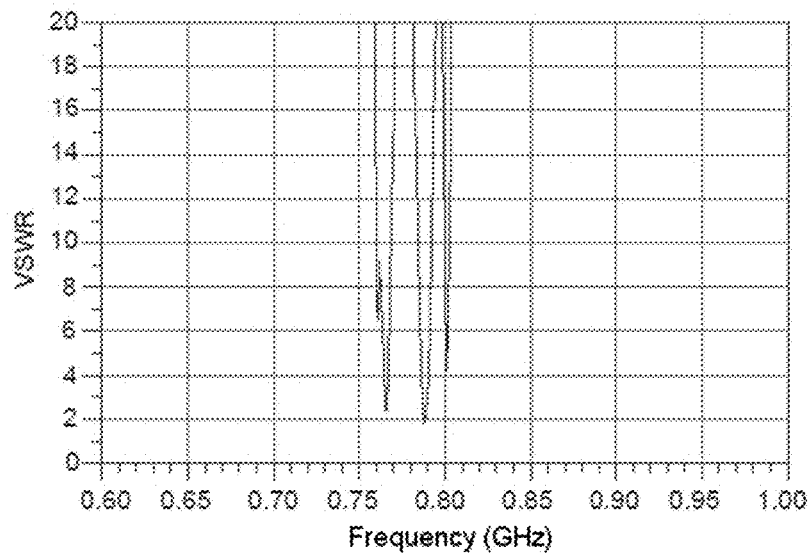
Figure 12D:
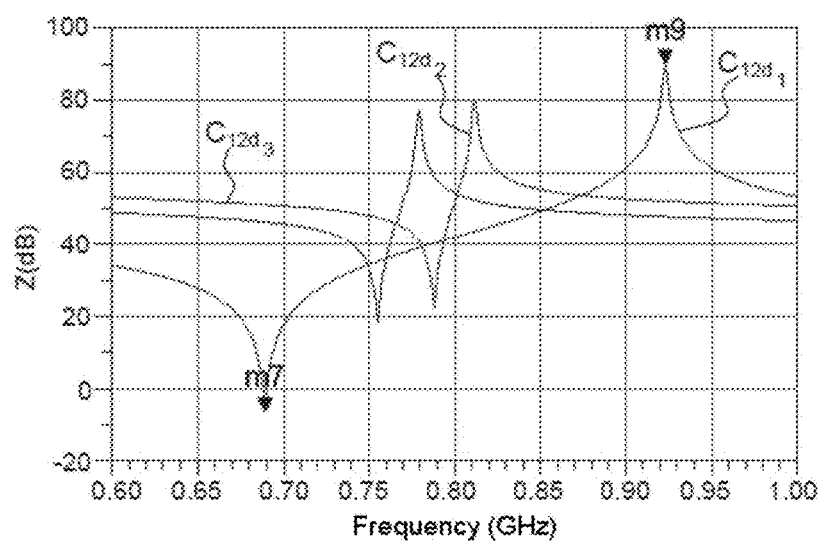
Figure 13A:
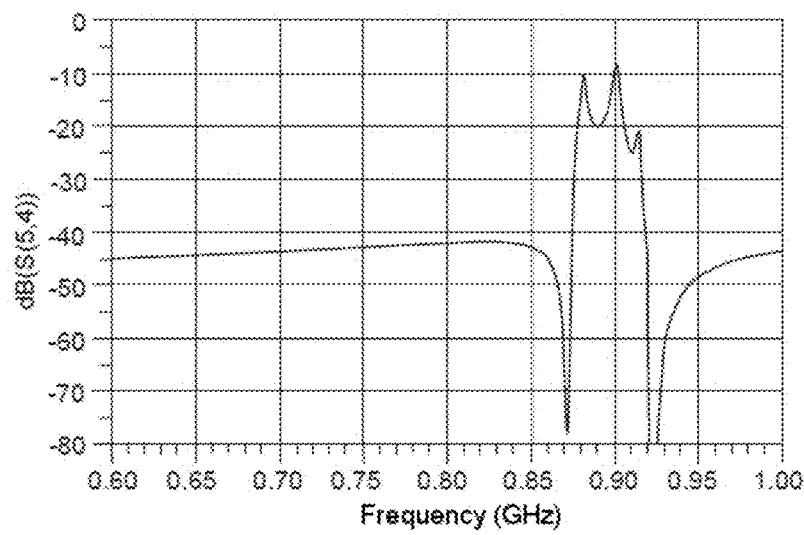
Figure 13B:
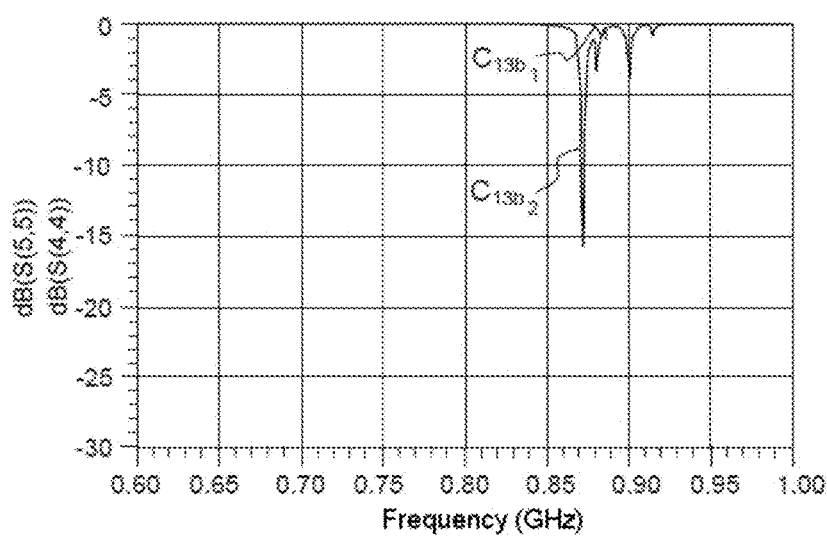
Figure 13C:
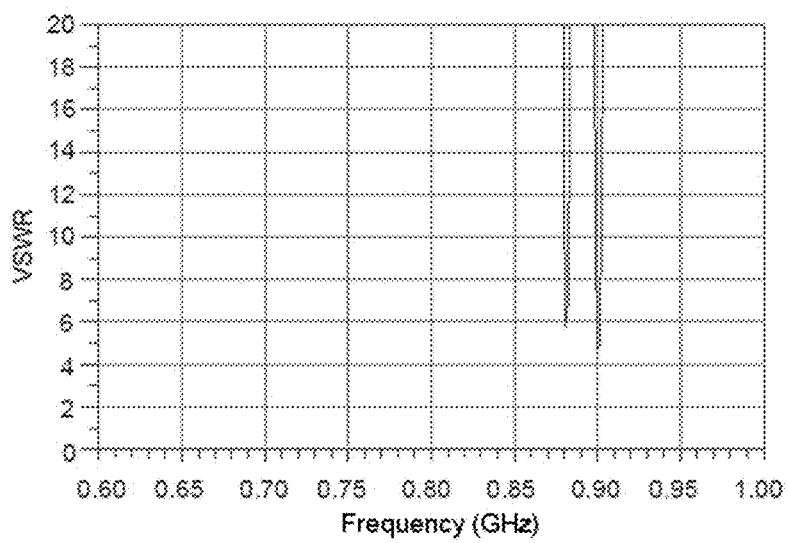
Figure 13D:
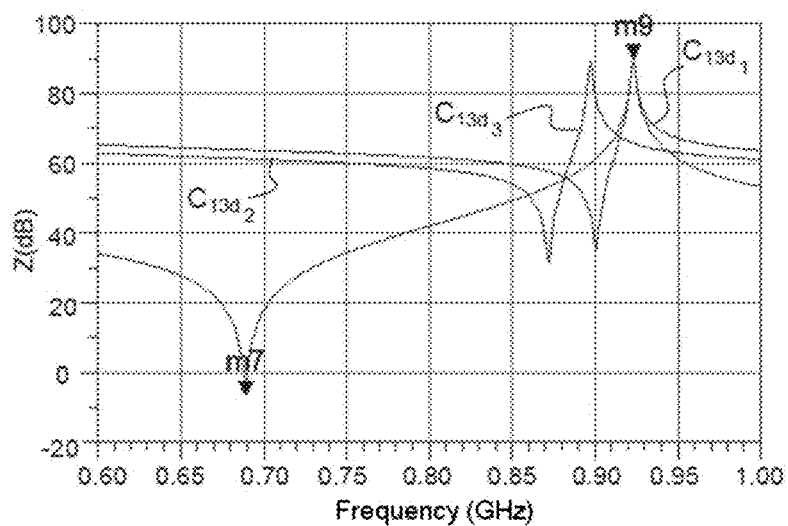
Figure 14A:
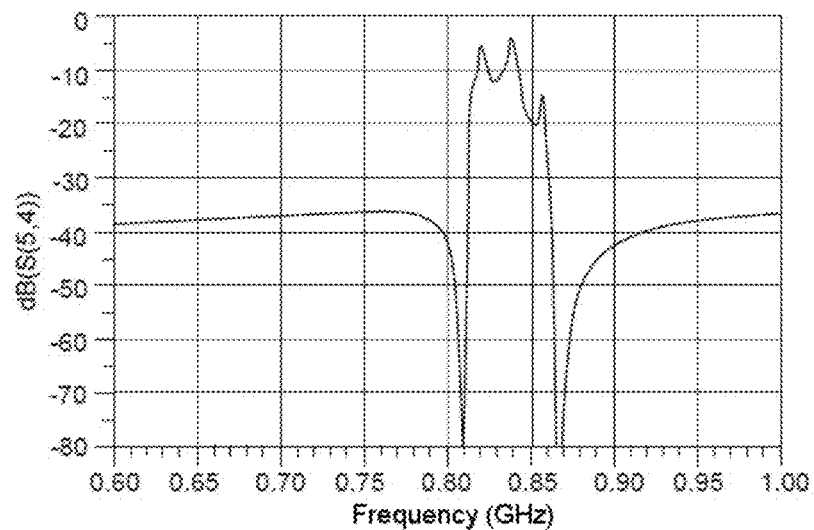
Figure 14B:
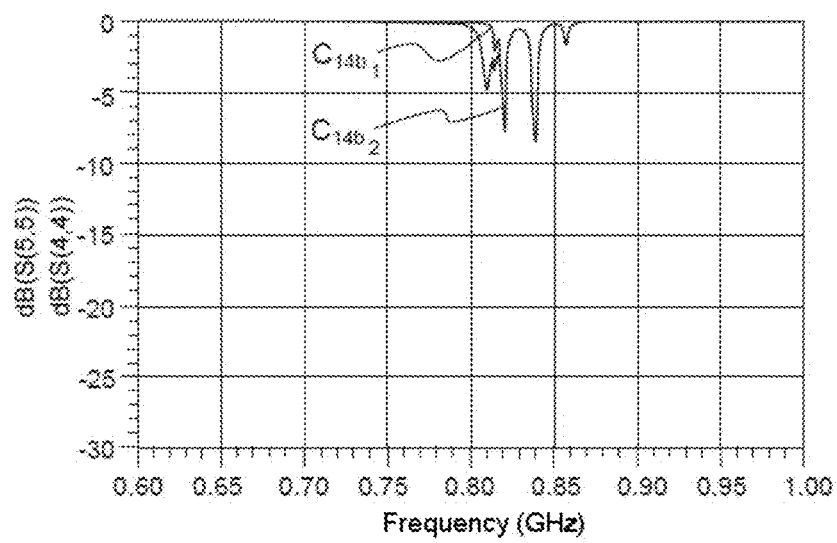
Figure 14C:
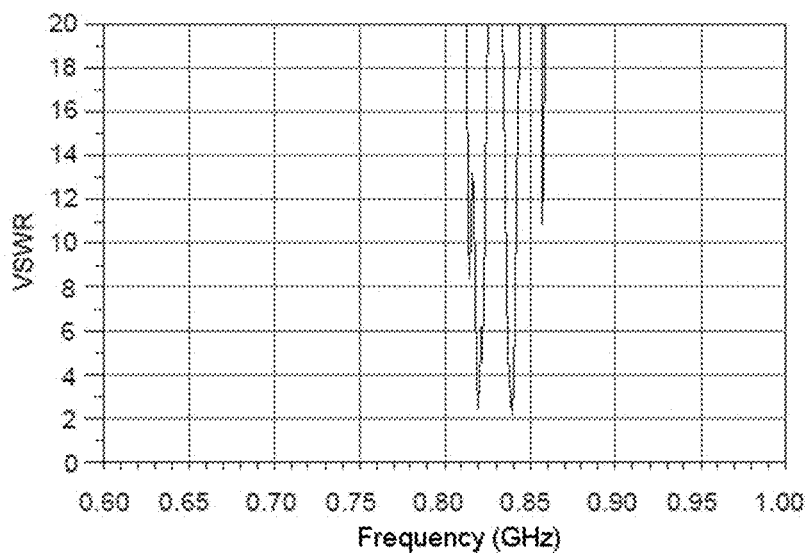
Figure 14D:
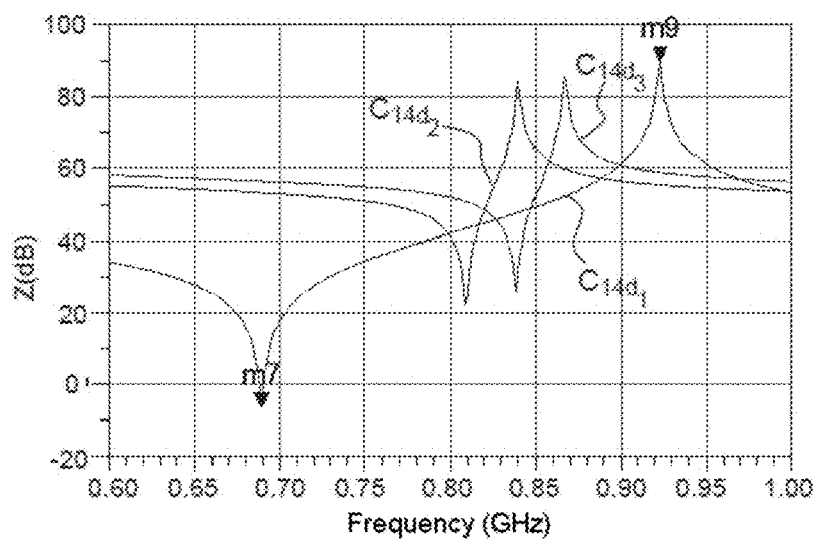
Figure 15A:
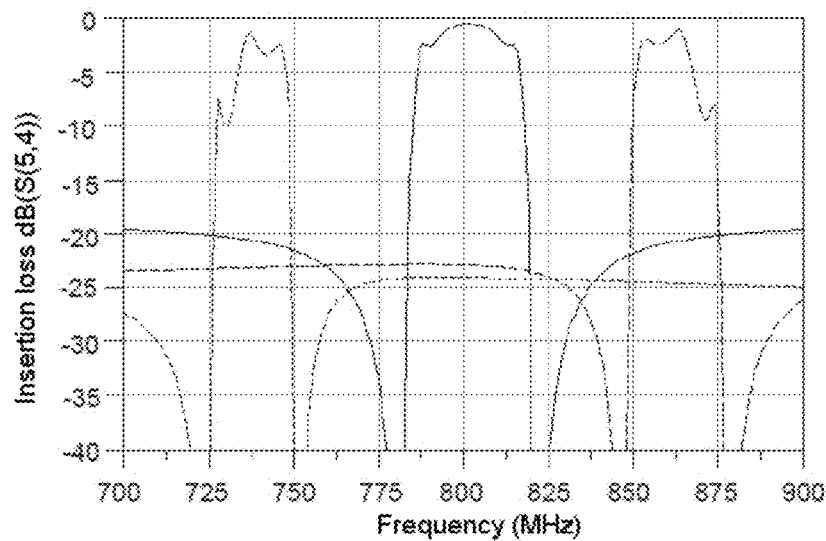
FIGS. 15a, 15b, 15c and 15d relate, respectively, to the insertion losses, to the matching, to the impedance (without series capacitor and without parallel capacitor) and to the impedance of the pairs of resonant circuits (with variable values of series capacitance and parallel capacitance)
Figure 15B:
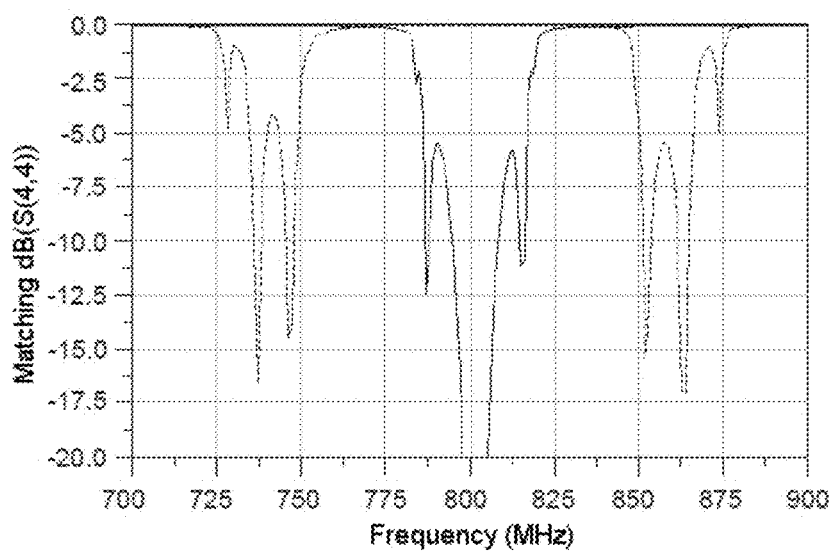
Figure 15C:
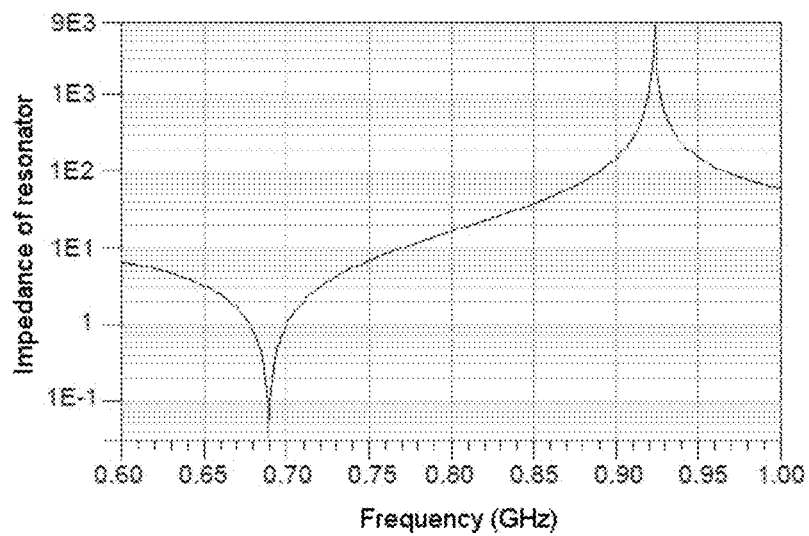
Figure 15D:
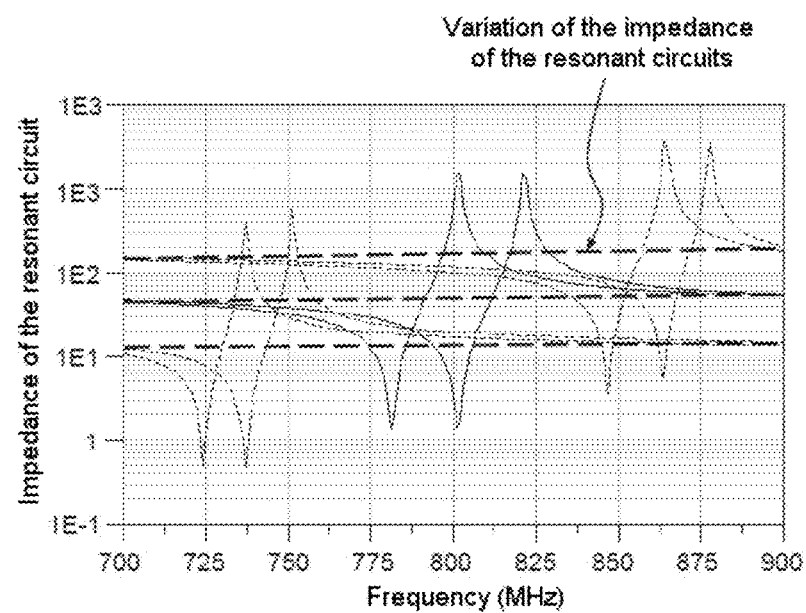
Figure 16A:
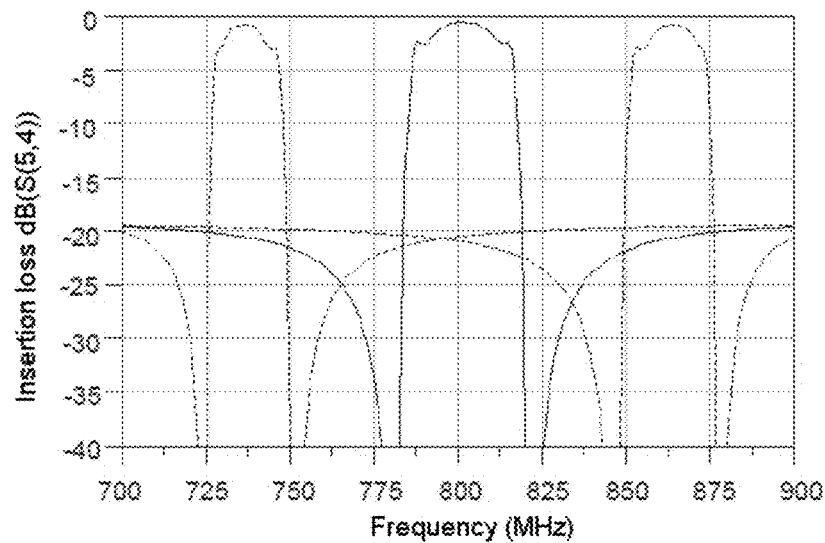
FIGS. 16a, 16b, 16c and 16d relate, respectively, to superimposed responses of the same filter in which the surface of the resonators varies, and, respectively, to the insertion losses, to the matching, to the impedance (without series capacitor and without parallel capacitor) and to the impedance of the pairs of resonant circuits (with fixed values of series capacitance and parallel capacitance)
Figure 16B:
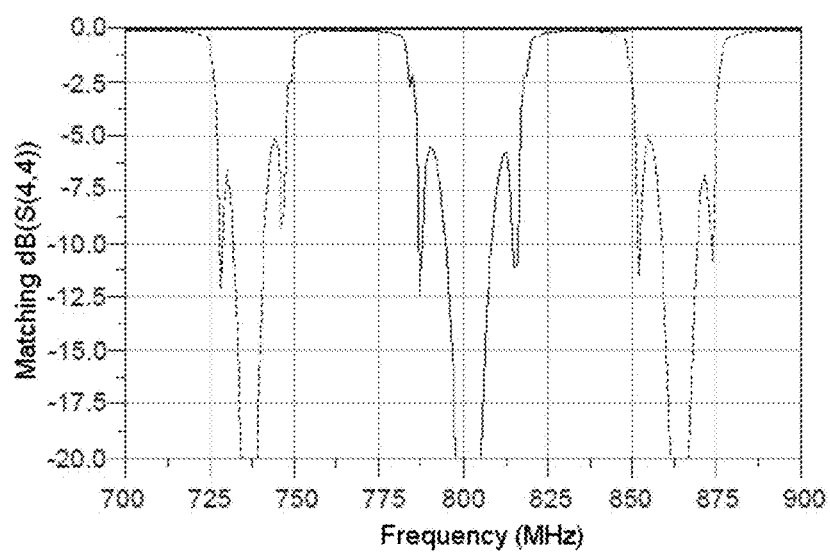
Figure 16C:
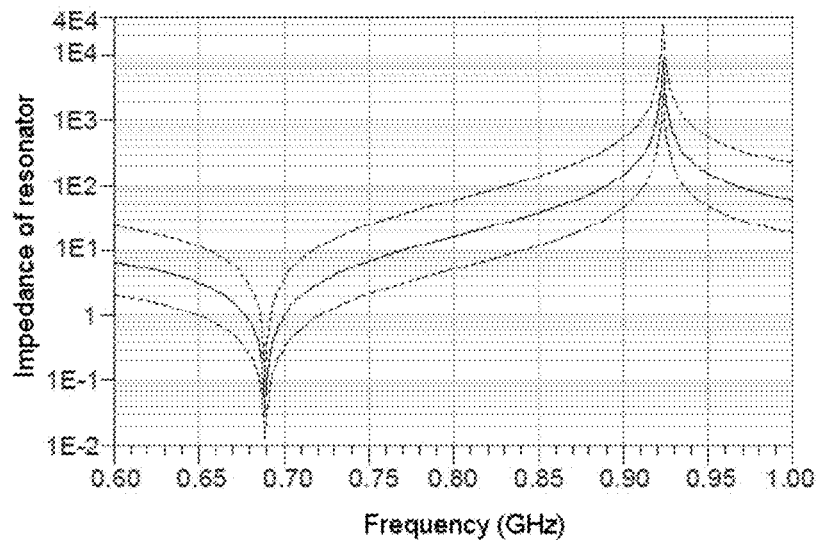
Figure 16D:
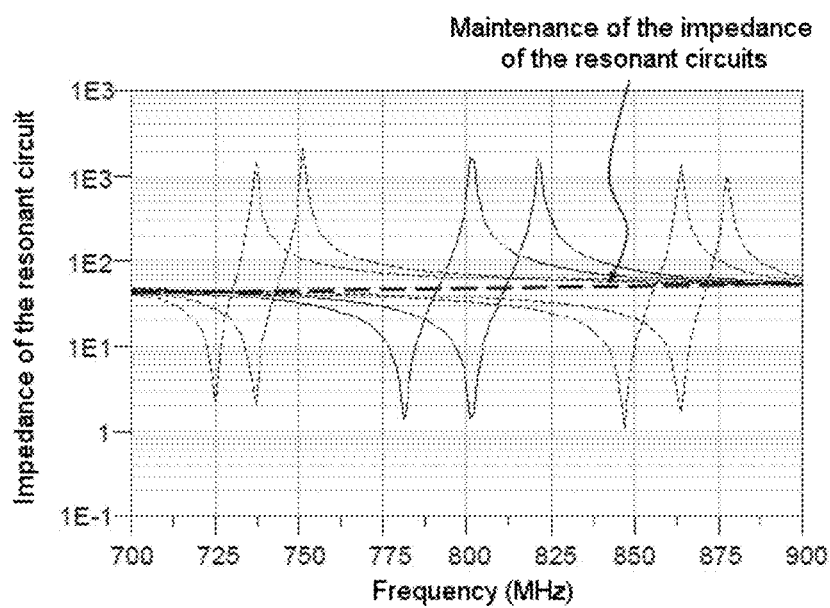
Figure 17:
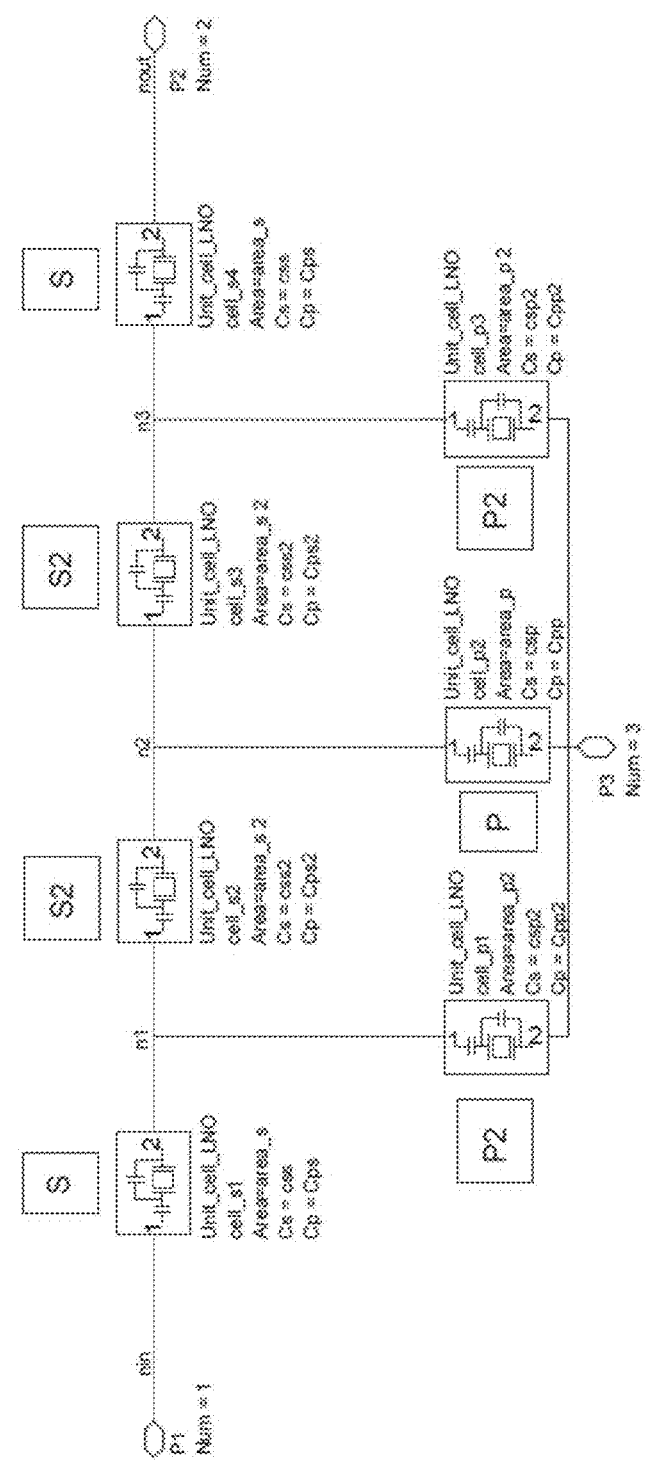
FIG. 17 shows an example of filter topology that can be used in different frequency bands.
Figure 18:
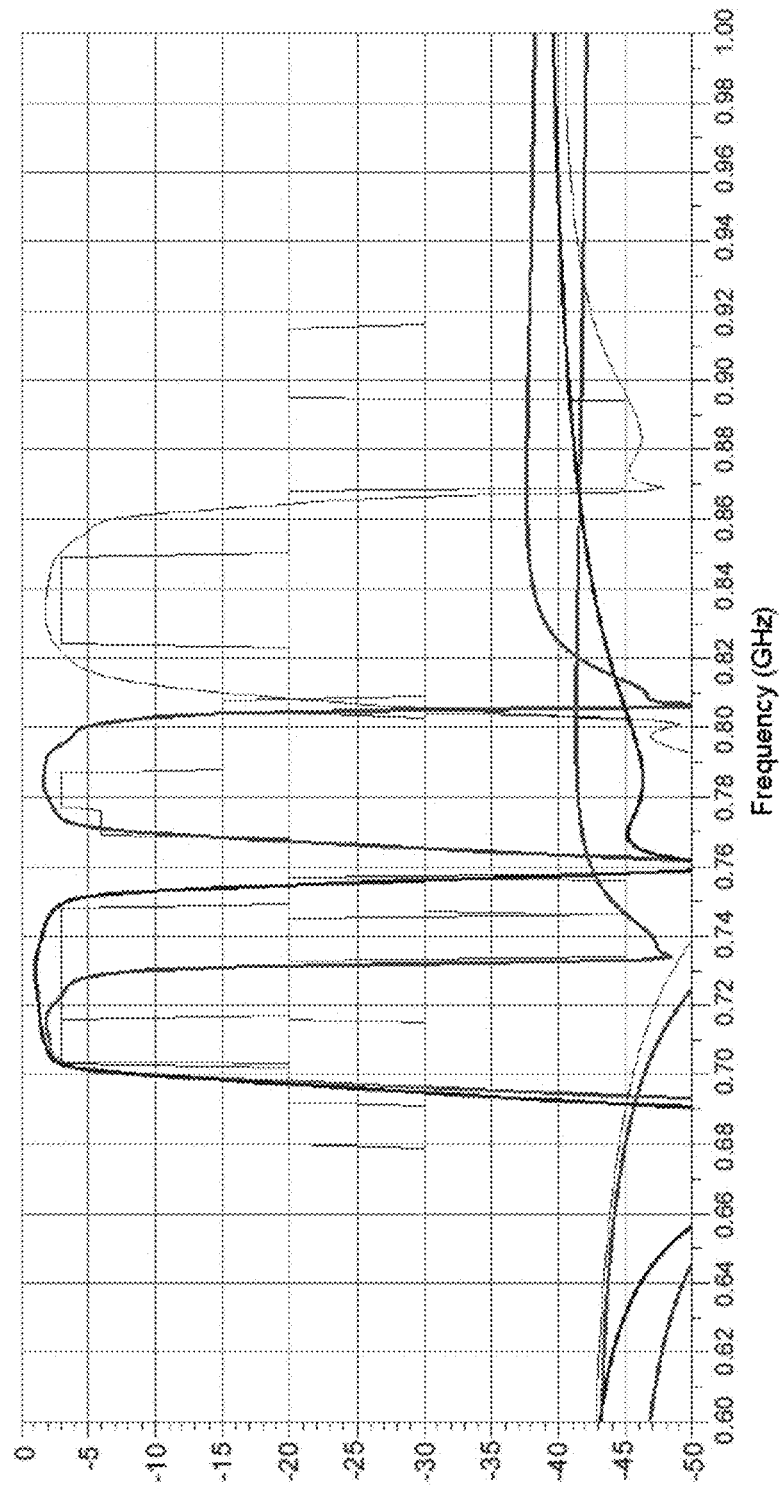
FIG. 18 shows the frequency response of the topology shown in FIG. 17.

As a general rule, the impedance Z of a resonator is characterized, in a first approach, by the impedance of its equivalent Butterworth-Van Dyke (BVD) model, described above and illustrated in FIG. 1, that is to say without allowance for any losses:

$$Z = \frac{1}{j\omega\Phi} \text{ where } \Phi = \frac{L_m C_m C_0 \omega^2 - C_0 - C_m}{L_m C_m \omega^2 - 1} = \frac{N}{D}$$

All the elements of this model are correlated. This means that Lm, Cm and Co are interdependent variables, determined by the technological characteristics of the resonator. The capacitance Co is determined by the geometrical dimensions of the resonator, and Lm and Cm are calculated in such a way that they allow for the resonance frequency $\omega_r$ and antiresonance frequency $\omega_a$ of said resonator, according to the following equations:

$$\omega_r^2 = \frac{1}{L_m C_m}$$

$$\omega_a^2 = \frac{C_0 + C_m}{L_m C_m C_0} = \omega_r^2 \left(1 + \frac{1}{\gamma}\right)$$

$$\gamma = \frac{C_0}{C_m}$$

where $$N = C_0 \cdot \left(D - \frac{1}{\gamma}\right)$$

Additionally, the characteristic impedance $Z_c$ of the resonator outside the distinctive frequencies can be defined when $C_m \to 0$ (and therefore, as a result, $\omega_r \to \infty$ and $\gamma \to \infty$). This is equivalent to eliminating the piezoelectric effect. It can then be seen that $Z_c$ corresponds to the impedance of a capacitor of a size Co.

$$Z_c = \frac{1}{j\omega C_0}$$

When components are associated in series and in parallel with this resonator, a new impedance $\overline{Z}$, characterized by new resonance and antiresonance frequencies, and a new characteristic impedance $\overline{Z}_c$ are obtained.

More precisely, in the case of a resonator associated with a capacitor in series Cs and a capacitor in parallel Cp, according to the arrangement shown in FIG. 19, it can then be demonstrated that the impedance $\overline{Z}$ has the new resonance and antiresonance frequencies, determined, respectively, by the cancellation of the denominator or the numerator of $\overline{\Phi}$, defined as follows:

$$\overline{Z} = \frac{1}{j\omega\overline{\Phi}}$$

where $$\overline{\Phi} = \frac{(N + C_p D) \cdot C_s}{N + (C_p + C_s) \cdot D}$$

And $$\overline{\omega}_r = \omega_r \sqrt{1 + \frac{1}{\gamma} \cdot \frac{C_0}{C_0 + C_p + C_s}}$$

-continued $$\overline{\omega}_a = \omega_r \sqrt{1 + \frac{1}{\gamma} \cdot \frac{C_0}{C_0 + C_p}}$$

The new characteristic impedance $\overline{Z}_c$ is defined as that of a capacitor of the following size:

$$\overline{C}_0 = \frac{(C_0 + C_p) \cdot C_s}{C_0 + C_p + C_s}$$

Therefore $$\overline{Z}_c = \frac{1}{j\omega \overline{C}_0}$$

Figure 20:
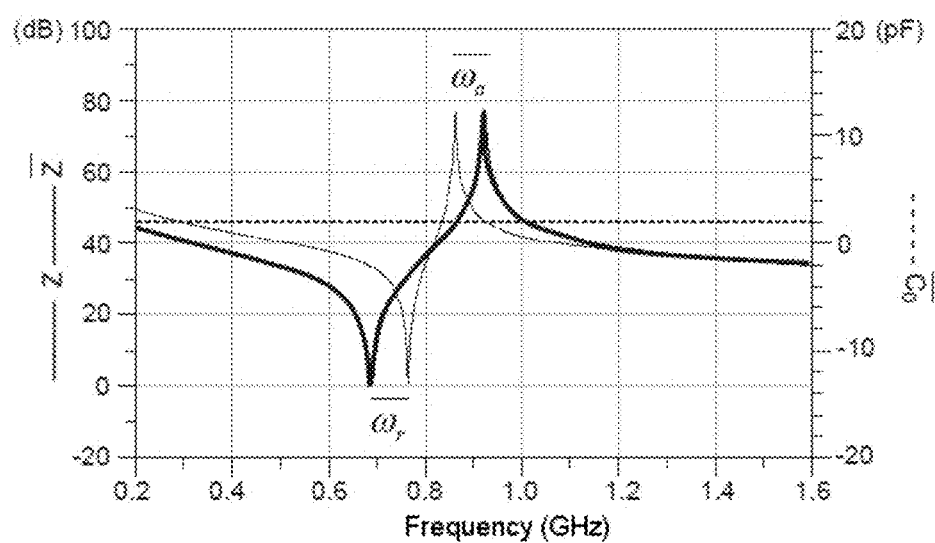
FIG. 20 shows the impedance of a resonator and the characteristic impedance of the resonant circuit according to the invention using said resonator.

FIG. 20 shows the frequency response of the impedance Z and that of $\overline{Z}$, as well as that of $\overline{C_0}$.

It is particularly interesting to note the constancy of the parameter $\overline{C_0}$ as a function of the frequency.

Thus there are three independent equations for defining three parameters ($\overline{Z}_c$, $\overline{\omega}_r$ and $\overline{\omega}_a$) on the basis of the intrinsic nature of the resonator ($Z_c$, $\omega_r$ and $\omega_a$) and the two associated capacitors. In other words, there is always one, and only one, solution for establishing the values $\overline{Z}_c$, $\overline{\omega}_r$ and $\overline{\omega}_a$ on the basis of Co, Cp and Cs. Thus, by varying the geometrical size of the resonator and the values of Cs and Cp, a pole and a zero associated with a chosen characteristic impedance can be freely positioned.

This characteristic is a fundamental characteristic of the present invention.

However, the range of possibilities for positive values of the capacitors Cp and Cs is limited in frequency by the lower boundary represented by the series resonance du resonator ($\omega_r$) and the upper boundary represented by its antiresonance ($\omega_a$), which is itself determined by the intrinsic coupling coefficient (characterized by the parameter γ in the equivalent model), which is also seen to appear in the form of constants in the equations of $\overline{\omega}_r$ and $\overline{\omega}_a$.

These limits are encountered when $C_s \to \infty$ and $C_p \to 0$.

Figure 21:
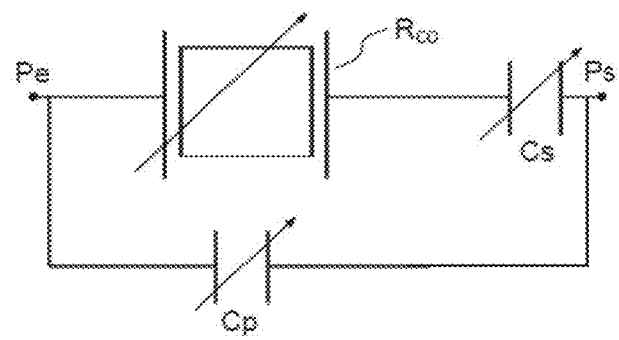
FIG. 21 shows schematically a second example of a resonant circuit according to the invention.

FIG. 21 shows a second variant of the invention in which the capacitor Cp, connected in parallel, is connected differently from that of the preceding variant. It is placed in parallel with the assembly formed by the resonator and the series element Cs. In this case, $\overline{\Phi}$ is defined as follows:

$$\overline{\Phi} = \frac{\Phi \cdot (C_s + C_p) + C_s \cdot C_p}{\Phi + C_s}$$

$$\overline{\omega}_r = \omega_r \sqrt{1 + \frac{1}{\gamma} \cdot \frac{C_0}{C_0 + C_s}}$$

$$\overline{\omega}_a = \omega_r \sqrt{1 + \frac{1}{\gamma} \cdot \frac{C_0}{C_0 + C_{sp}}}$$

Where $$C_{sp} = \frac{C_s \cdot C_p}{C_s + C_p}$$

Additionally, the characteristic impedance $\overline{Z}_c$ is then defined as that of a capacitor of the following size:

$$\overline{C}_0 = \frac{C_s + C_p}{C_s + C_0} \cdot (C_0 + C_{sp})$$

As a general rule, in order to make the characteristic impedance of a resonator variable, it is necessary to cause its equivalent static capacitance to vary. A first way of doing this is to cause the geometrical dimensions of the resonator to vary. Although there are methods in the field of microwave cavity filters for modifying the physical dimensions of the resonators by mechanical means (using servomotors or simply adjusting screws), these means are not feasible in the case of integrated resonators.

For this reason, the present applicants propose, by way of example, the solution described below in a first exemplary embodiment.

First Exemplary Embodiment

Figure 22:
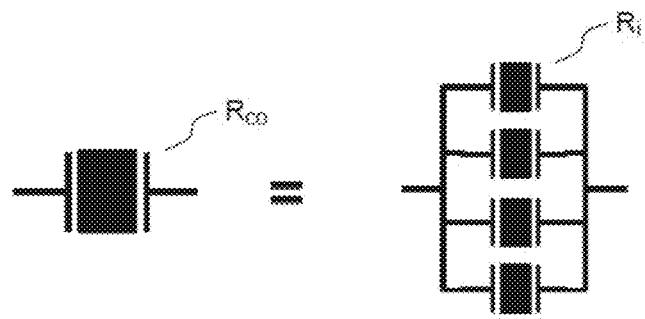
FIG. 22 shows the equivalence of a large resonator and a set of small resonators arranged in parallel.

As shown in FIG. 22, a single "large" resonator $R_{C0}$ with a variable static capacitance $C_0$ can be equivalent to a group of elementary resonators Ri arranged in parallel, the different resonators having identical resonance and antiresonance frequencies, but having a static capacitance such that the sum of the elementary static capacitances is equal to the static capacitance $C_0$.

Thus, in the context of a BAW resonator, with a size of 10N×10N, it is possible to construct a checkerboard array of 100 BAW resonators with a size of N×N, connected electrically in parallel with one another (the square shape suggested by the term "checkerboard array" is not limiting in itself: in fact, any geometrical surface may be placed in parallel with another).

According to the present invention, it is then useful for the resonant circuit to comprise:

at least said group formed by an assembly of elementary resonators Ri;

of reactive components; and of selective control addressing means, which may typically be switches with associated controls.

Figure 23:
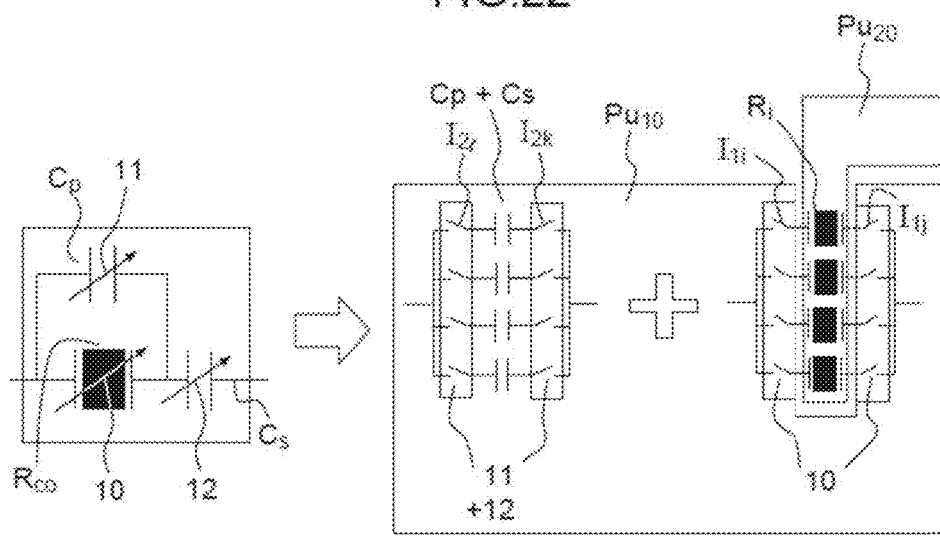
FIG. 23 shows a first embodiment comprising means for selectively controlling a subset of resonators in the series of resonators shown schematically in FIG. 22 and means for controlling the reactive elements, and associating two chips comprising the resonators and the control means.

This configuration is illustrated in FIG. 23, showing this first embodiment comprising switches and associated controls, for switching elementary resonators and unitary reactive components.

At the present time, it is possible to design BAW resonators with a wide range of variation on the basis of LNO material, using a known manufacturing process described in the paper by Pijolat, M. Deguet, C. Billard, C. Mercier, D., Reinhardt, A., "Bias controlled electrostrictive longitudinal resonance in X-cut lithium niobate thin films resonator", Applied Physics Letters, Volume: 98, Issue: 23.

However, this method is not currently compatible with the production of both switches and controls on the same substrate.

For this reason, in order to produce a resonator $R_{C0}$ made of LNO, comprising a set of elementary resonators Ri controllable from first control means, associated with a first series matching element Cs and a second parallel matching element Cp that can be controlled via control means, a configuration proposed in the present example provides, in combination:

on the one hand, a chip $Pu_{20}$ containing at least the resonator $R_{C0}$ comprising at least two elementary resonators Ri, made of LNO;

and, on the other hand, a chip $Pu_{10}$ containing the switches and the reactive components Cp and Cs. More precisely, the chip $Pu_{10}$ comprises the resonator control means 10, comprising a set of switches and $I_{1i}$ for $I_{1j}$ controlling the elementary resonators, and the control means 11+12, comprising a set of switches $I_{2k}$ and $I_{2l}$.

These two chips are then assembled facing one another (in a flip-chip configuration), via interconnections (using balls, copper pillars, etc., for example), using the "copper pillar" method in which copper contacts are formed in the shape of pillars on each of the chips, are aligned facing one another, and are then welded together by metal bonding methods (mechanical compression and heating) to reduce the footprint and resistance of these interconnections to a minimum.

According to this approach, the switches can be designed using transistors whose sizing is based on a compromise between their internal parasitic resistance in the "closed" state and their internal parasitic capacitance in the "open" state. The elementary capacitors are formed in a conventional manner by sandwiching a thin dielectric layer between two metal electrodes. The quality of the dielectric material and the electrodes has an effect on the operation of the assembly.

In order to reduce the resistive losses and parasitic capacitances of the assembly as far as possible, while withstanding any local overvoltages (typically 50 V for the power levels of the order of several watts which are used), these switches and these capacitors may advantageously be formed on a substrate of the high resistivity SOI type.

Figure 24:
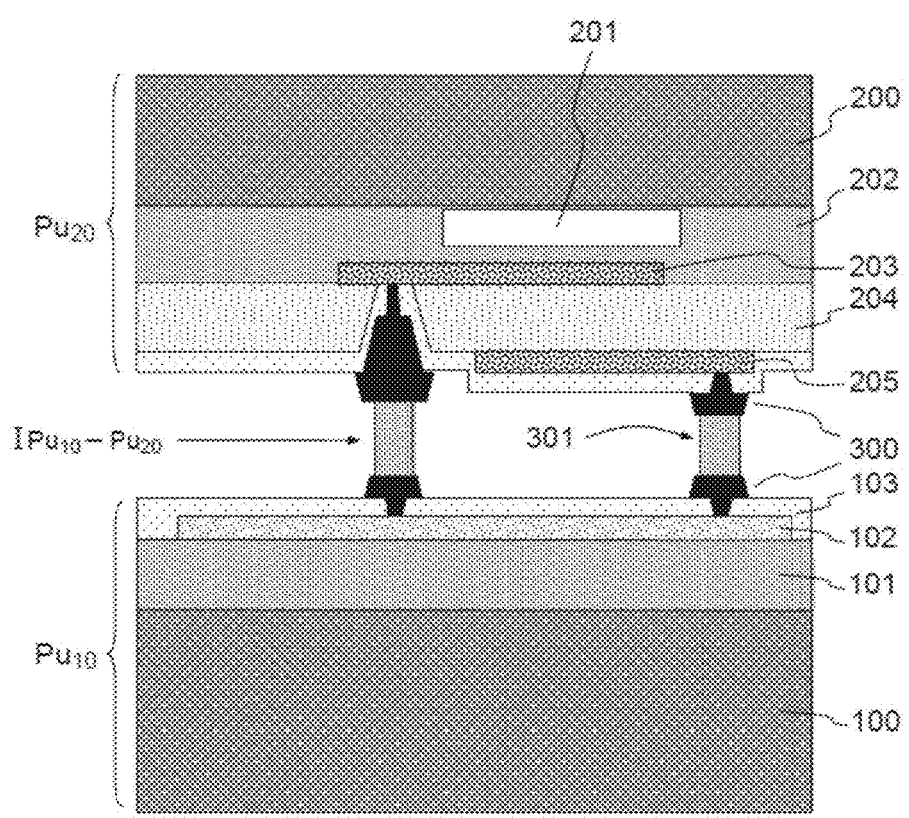
FIG. 24 shows in detail an example of means of interconnection between two chips shown in FIG. 23.

FIG. 24 shows in greater detail an example of interconnections between the two chips in a case where a first chip is made of LNO and a second chip is made of HR-SOI (by an integrated circuit manufacturing technology using a thin layer of high-resistivity (HR) silicon placed on a layer of electrical insulation, which itself covers a massive silicon substrate).

The chip $Pu_{10}$ comprises:
a substrate 100 which may be made of silicon;
an electrical insulator 101;
an electrical circuit 102 comprising the capacitors, the switches and control circuits;
a passivation layer 103.

The chip $Pu_{20}$ comprises:
a substrate 200 made of silicon;
an acoustic insulator 201;
an electrical insulator 202;
a lower electrode 203;
a layer of LNO material 204;
an upper electrode 205.

The chips $Pu_{10}$ and $Pu_{20}$ are interconnected by pillars $I_{Pu10-Pu20}$ comprising an intermediate metallization part 300 and a contact metallization part 301.

Second Exemplary Embodiment

According to a second embodiment, the resonant circuit comprises surface acoustic wave resonators. These resonators are advantageously formed on highly piezoelectric substrates such as lithium niobate, having a crystal orientation allowing the excitation of strongly coupled surface waves, for example those of the "pseudo-surface wave" type. In the case of SAW resonators, the characteristic impedance does not depend on the surface of a flat capacitor, but on a capacitance produced by the arrangement of interdigitated electrodes. A SAW resonator with 10 N electrodes can be produced by the parallel placing of 10 SAW resonators, each having N electrodes. The implementation in respect of the controls and interconnections may be equivalent to that described for the first exemplary embodiment.

Third Exemplary Embodiment

According to a third embodiment, the resonators are electrostrictive resonators, that is to say those having piezoelectric properties that can be activated by the effect of a voltage. This is the case, for example, with BST material, a material having a crystallographic organization known as perovskite. This material was used in the case of patent application EP2405574.

Figure 25:
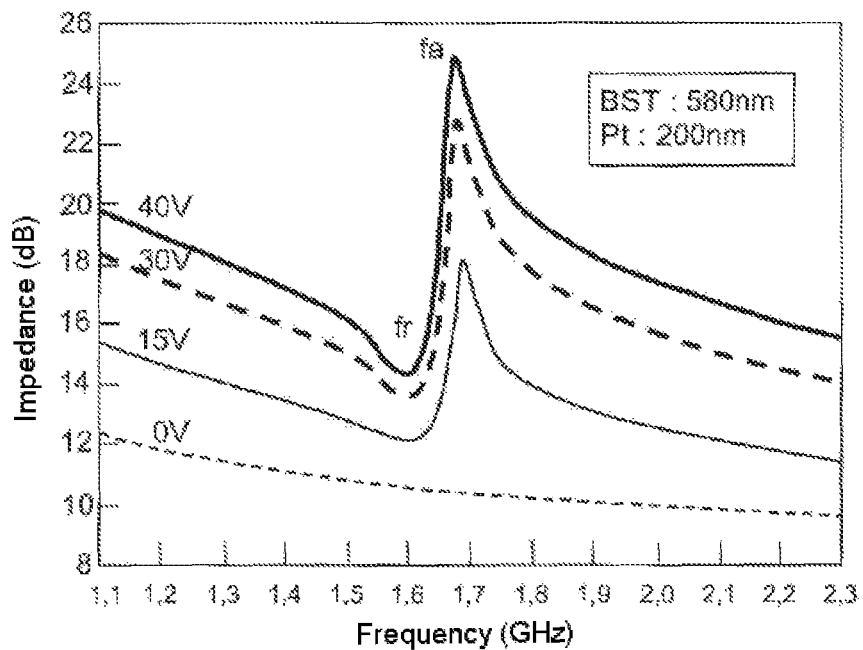
FIG. 25 shows the variation of impedance of a resonator based on perovskite material, as a function of the frequency and the applied voltage, which can be used in a resonant circuit according to the invention.
Figure 25:
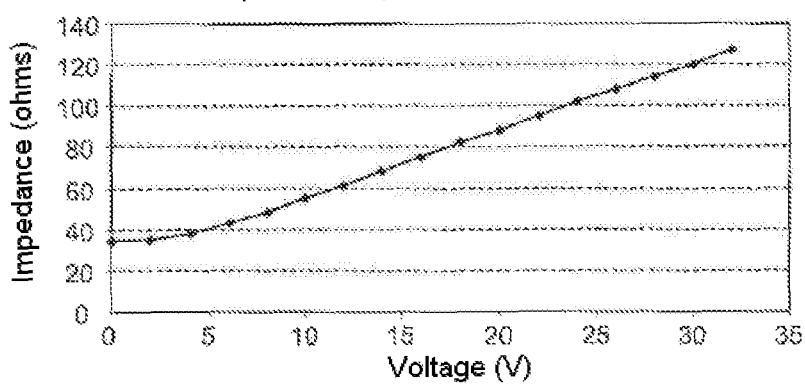

In this case, a single resonator can be used, the application of a d.c. voltage to the terminals of said resonator causing a variation of the static capacitance of the resonator, as illustrated, for example, in FIG. 25 which shows figures extracted from patent application EP 2405574, showing, respectively, the variation of impedance of a resonator based on perovskite material as a function of the frequency and the applied voltage. In this patent application, it is disclosed that the resonators are used in an operating region where the resonance and antiresonance frequencies are relatively constant. The production of a filter with a fixed central frequency and bandwidth, but a variable characteristic impedance, is proposed here. This type of filter can be ranked among dynamic adaptation systems, for example those described in the patents of Emeric De Foucauld and others (EP2509227 or EP2509222).

It should also be noted that, in patent application EP 2405574, there is no question of causing the frequencies of the filter to vary. On the contrary, the resonators operate in an area where the filter thus formed remains stable in terms of frequency.

Figure 26:
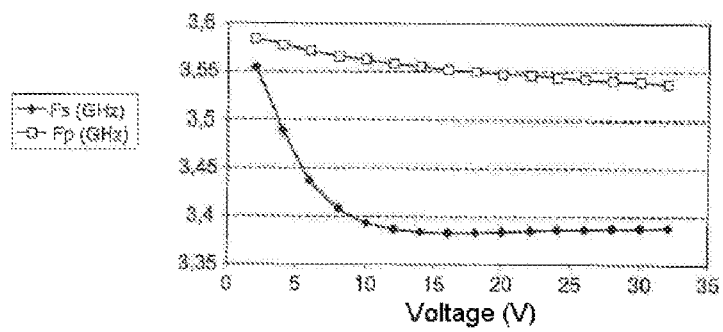
FIG. 26 shows the variation of the resonance and antiresonance frequencies as a function of the applied voltage for a resonator based on perovskite material.

In the area where a frequency variation is present, a large disparity is seen in the relative positioning of the resonance and antiresonance frequencies, as indicated in FIG. 26 which reproduces FIG. 12 of patent application EP 2405574.

Thus the antiresonance frequency (Fp) decreases slightly (1.5%) when the applied voltage increases (up to 10 V), while the resonance frequency (Fs) decreases by 5% over the same voltage range. In this operating region, the characteristic impedance remains at 50Ω+/−10Ω. This type of variation cannot be used to provide the solution according to the present invention, since the two distinctive frequencies and the characteristic impedance vary in an interdependent manner.

However, on the basis of the approach developed in this patent application EP2405574, and with the aim of controlling the resonance and antiresonance frequencies according to the present invention, these electrostrictive resonators can be associated (in their operating region where the distinctive frequencies are approximately stable) with variable capacitors in series and in parallel. By means of this approach it is possible to design a new assembly (Co, Cs, Cp) which can be used for the independent determination of the characteristic impedance, the resonance frequency, and the antiresonance frequency.

It should be noted that the use of BST for producing the resonators makes it possible to co-integrate variable capacitors within the same chip, according to the method described in patent EP2713508. In fact, by preventing the elastic movements of the layer (by means of a mechanical overload, for example), an acoustic resonator can be converted into a simple variable capacitor.

This chip is then connected to an active circuit responsible for supplying a bias voltage for each resonator and capacitor, so that the values of the static capacitances of the resonators and of the capacitors added to the resonators can be adjusted dynamically.

Figure 27:
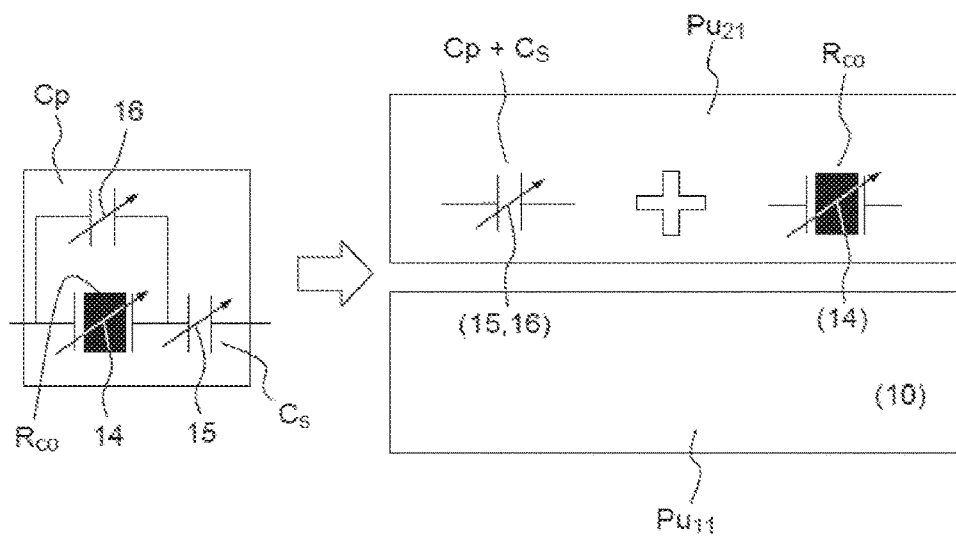
FIG. 27 shows an embodiment comprising an electrostrictive resonator associated with ferroelectric capacitors.

FIG. 27 shows schematically this third exemplary circuit according to the invention, in which two chips are interconnected. One chip combines the functions of resonators $R_{C0}$ and the capacitors Cp and Cs, while another chip combines the control means for the ferroelectric capacitors with those for the electrostrictive resonators. More precisely, the first chip $Pu_{11}$ comprises the control means 14 of the electrostrictive resonator and the control means 15, 16 of the ferroelectric capacitors. The second chip $Pu_{21}$ comprises the electrostrictive resonator $R_{C0}$ and the ferroelectric capacitors Cp and Cs.

Fourth Exemplary Embodiment

According to a fourth embodiment, the reactive components are made with active circuits.

Figure 28A:
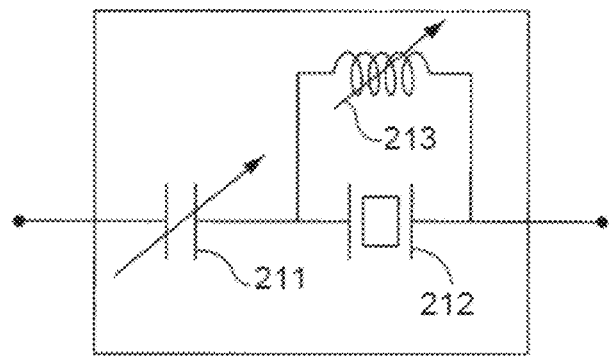
FIGS. 28a and 28b show examples of reactive components that can be used in a resonant circuit according to the invention.
Figure 28B:
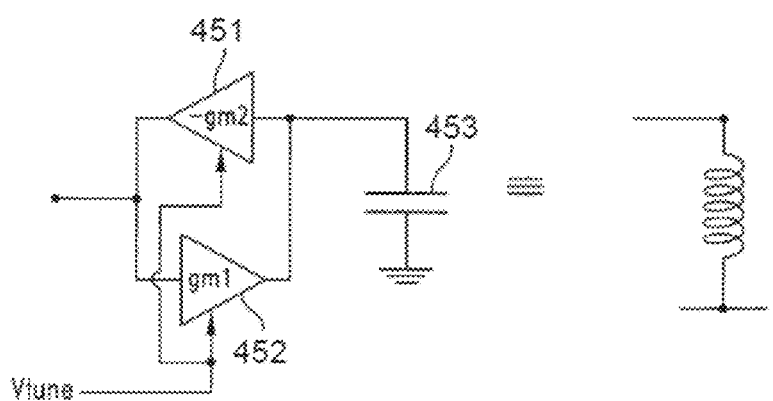

In fact, there is a known way of making these reactances by using electronic circuits based on transistors, instead of using passive elements. The variable capacitors are formed in an ordinary manner with diodes connected inversely, the capacitance of which depends on the d.c. voltage applied to their terminals. The reactive components used may also be those described, for example, in U.S. Pat. No. 7,187,240, referring to the association of a BAW resonator with reactive components, the latter being made as indicated on the figures extracted from U.S. Pat. No. 7,187,240 and shown in FIGS. 28a and 28b.

The invention claimed is:

1. A resonant circuit with a characteristic impedance stabilized at a chosen value, comprising an input terminal and an output terminal, and at least:
a group of N resonators, where N>1, said group of N resonators having a same resonance frequency and a same antiresonance frequency;
the group of N resonators configured to provide a variable static capacitance;
a first impedance matching element and a second impedance matching element having a non-zero reactance, the first impedance matching element being in series with said group of N resonators, and the second impedance matching element being in parallel with said group of N resonators,
said resonant circuit comprising:
first means for controlling said group of N resonators, enabling a static capacitance of said group of N resonators to be fixed at a first value;
second control means, enabling the impedance of the first impedance matching element and that of the second impedance matching element to be fixed at second values;
said first and second values being such that:
a triplet of values composed of the static capacitance of said group of N resonators, the impedance of the first impedance matching element, and the impedance of the second impedance matching element being used to determine the following triplet of parameters:
the characteristic impedance $\overline{Z}_c$ of an assembly formed by said group of N resonators, said first impedance matching element and said second matching element;
the resonance frequency $\overline{\omega}_r$ of said assembly formed by said group of N resonators, said first impedance matching element and said second matching element;
the antiresonance frequency $\overline{\omega}_a$ of said assembly formed by said group of N resonators, said first impedance matching element and said second matching element, in order to stabilize the impedance of said circuit at a chosen characteristic impedance.

2. The resonant circuit according to claim 1, wherein:
said group of N resonators consists of a plurality of resonators:
said first control means comprising a switching circuit for selecting and connecting one or more resonators.

3. The resonant circuit according to claim 2, wherein the resonators are bulk acoustic wave resonators which may have different geometrical dimensions.

4. The resonant circuit according to claim 2, wherein the resonators are surface acoustic wave resonators which may have different arrangements of electrodes on the surface of a piezoelectric substrate.

5. The resonant circuit according to claim 1, wherein:
said resonator has a variable capacitance whose value is a function of the value of an electrical control signal;
said first means comprising means for causing said electrical control signal to vary.

6. The resonant circuit according to claim 5, wherein said resonator is an electrostrictive resonator based on BST material.

7. The resonant circuit according to claim 1, wherein at least one impedance matching element is a capacitor, an inductance or a set of passive elements.

8. The resonant circuit according to claim 1, wherein at least one impedance matching element is an active circuit.

9. The resonant circuit according to claim 8, wherein the active circuit comprises transistors.

10. The resonant circuit according to claim 1, wherein the second impedance matching element is connected, on the one hand, to one of the input/output terminals, and on the other hand to an intermediate node between the group of resonators and said first impedance matching element.

11. The resonant circuit according to claim 1, wherein the second impedance matching element is placed between the input and output terminals, fitted in parallel with the assembly composed of the group of resonators and the first impedance matching element, placed in series.

12. The resonant circuit according claim 1, comprising:
a first chip comprising at least said first control means for fixing the static capacitance of said group of resonators at a first value;
a second chip comprising said group of resonators;
means for the interconnection of said first control means with said group of resonators.

13. The resonant circuit according to claim 12, wherein the first chip also comprises the first and second impedance matching elements.

14. The resonant circuit according to claim 12, wherein the second chip also comprises the first and second impedance matching elements.

15. A filter comprising a set of resonant circuits according to claim 1.

16. A duplexer comprising a set of resonant circuits according to claim 1.

17. A device comprising a set of at least two resonant circuits according to claim 1 and having an input impedance and an output impedance, contained between an input port and an output port, comprising
first means for controlling the group of resonators and second means for controlling the first and second impedance matching elements, for adjusting:
the characteristic impedance of each of said circuits;
the resonance and antiresonance frequencies of each of said circuits.

18. The device comprising a set of at least two resonant circuits according to claim 1, wherein said first means for controlling the group of resonators and said second means for controlling the first and second impedance matching elements cause variations of the triplets of values composed of the static capacitance of said group, the impedance of the first impedance matching element, and the impedance of the second impedance matching element, for the purpose of:
adjusting the values of characteristic impedance of the two resonant circuits to fixed values;
causing the resonance and antiresonance frequencies of the two resonant circuits to vary.

19. The device comprising a set of at least two resonant circuits according to claim 1, wherein said first means for controlling the group of resonators and said second means for controlling the first and second impedance matching elements cause variations of the triplets of values composed of the static capacitance of said group, the impedance of the first impedance matching element, and the impedance of the second impedance matching element, for the purpose of:
causing the values of characteristic impedance of the two resonant circuits to vary;
adjusting the resonance and antiresonance frequencies of the two resonant circuits to fixed values.

20. A resonant circuit with a characteristic impedance stabilized at a chosen value, comprising an input terminal and an output terminal, and at least:
a group of N resonators, where N said group of N resonators having a same resonance frequency and a same antiresonance frequency;
a first impedance matching element and a second impedance matching element having a non-zero reactance, the first impedance matching element being in series with said group of N resonators, and the second impedance matching element being in parallel with said group of N resonators,
said resonant circuit comprising:
first means for controlling said group of N resonators, enabling a static capacitance of said group of N resonators to be fixed at a first value;
second control means, enabling the impedance of the first impedance matching element and that of the second impedance matching element to be fixed at second values;
said first and second values being such that:
a triplet of values composed of the static capacitance of said group of N resonators, the impedance of the first impedance matching element, and the impedance of the second impedance matching element being used to determine the following triplet of parameters:
the characteristic impedance $\overline{Z}_c$ of an assembly formed by said group of N resonators, said first impedance matching element and said second matching element;
the resonance frequency $\overline{\omega}_r$ of said assembly formed by said group of N resonators, said first impedance matching element and said second matching element;
the antiresonance frequency $\overline{\omega}_a$ of said assembly formed by said group of N resonators, said first impedance matching element and said second matching element, in order to stabilize the impedance of said circuit at a chosen characteristic impedance,
wherein:
said group of N resonators consists of a plurality of resonators:
said first control means comprising a switching circuit for selecting and connecting one or more resonators.

* * * * *